United States Patent
Son et al.

(10) Patent No.: US 9,899,408 B2
(45) Date of Patent: Feb. 20, 2018

(54) NON-VOLATILE MEMORY DEVICE HAVING VERTICAL STRUCTURE AND METHOD OF MANUFACTURING THE SAME

(71) Applicant: SAMSUNG ELECTRONICS CO., LTD., Suwon-si, Gyeonggi-Do (KR)

(72) Inventors: Young-Hwan Son, Hwaseong-si (KR); Young-Woo Park, Seoul (KR); Jae-Duk Lee, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/189,205

(22) Filed: Jun. 22, 2016

(65) Prior Publication Data
US 2017/0062468 A1    Mar. 2, 2017

(30) Foreign Application Priority Data
Aug. 26, 2015    (KR) .................. 10-2015-0120543

(51) Int. Cl.
*H01L 27/11582* (2017.01)
*H01L 27/1157* (2017.01)

(52) U.S. Cl.
CPC .... *H01L 27/11582* (2013.01); *H01L 27/1157* (2013.01)

(58) Field of Classification Search
CPC .................................................. H01L 27/1582
USPC .................................................. 257/324
See application file for complete search history.

(56) References Cited

U.S. PATENT DOCUMENTS

| | | | |
|---|---|---|---|
| 8,569,827 B2 | 10/2013 | Lee et al. | |
| 8,748,249 B2 | 6/2014 | Yang et al. | |
| 8,872,183 B2 | 10/2014 | Chang et al. | |
| 8,969,948 B2 | 3/2015 | Simsek-Ege et al. | |
| 2004/0094796 A1* | 5/2004 | Lee | H01L 21/76897 257/325 |
| 2010/0013049 A1* | 1/2010 | Tanaka | H01L 21/76816 257/532 |
| 2014/0003148 A1 | 1/2014 | Sun et al. | |
| 2015/0008499 A1 | 1/2015 | Lee et al. | |
| 2015/0060977 A1 | 3/2015 | Lee et al. | |
| 2015/0060979 A1 | 3/2015 | Lee et al. | |

* cited by examiner

*Primary Examiner* — Kenneth Parker
*Assistant Examiner* — Warren H Kilpatrick
(74) *Attorney, Agent, or Firm* — F. Chau & Assocoates, LLC

(57) ABSTRACT

A non-volatile memory device having a vertical structure includes: a first interlayer insulating layer on a substrate; a first gate electrode disposed on the first interlayer insulating layer; second interlayer insulating layers and second gate electrodes alternately stacked on the first gate electrode; an opening portion penetrating the first gate electrode, the second interlayer insulating layers, and the second gate electrodes and exposing the first interlayer insulating layer; a gate dielectric layer covering side walls and a bottom surface of the opening portion; and a channel region formed on the gate dielectric layer, and penetrating a bottom surface of the gate dielectric layer and the first interlayer insulating layer and thus electrically connected to the substrate, wherein a separation distance between side walls of the gate dielectric layer in a region which contacts the first gate electrode is greater than that in a region which contacts any one of the second gate electrodes.

19 Claims, 35 Drawing Sheets

NON-VOLATILE MEMORY DEVICE HAVING VERTICAL STRUCTURE AND METHOD OF MANUFACTURING THE SAME

CROSS-REFERENCE TO RELATED APPLICATION

This application claims priority under 35 U.S.C. § 119 to Korean Patent Application No. 10-2015-0120543, filed on Aug. 26, 2015, in the Korean Intellectual Property Office, the disclosure of which is incorporated by reference herein in its entirety.

TECHNICAL FIELD

The inventive concept relates to a non-volatile memory device having a vertical structure and a method of manufacturing the non-volatile memory device.

DISCUSSION OF RELATED ART

Volume miniaturization and high-capacity data processing are usually required for the modern electronic products. To fulfill these requirements, a non-volatile memory device having a vertical transistor structure instead of a conventional memory device having a horizontal transistor structure has been proposed. Recently, channel hole formation technology, which may ensure process simplification and reliability, has been adopted for the processes of manufacturing non-volatile memory devices having feature sizes highly miniaturized.

SUMMARY

The inventive concept provides a non-volatile memory device having a vertical structure, which may have simplified manufacturing processes and constant reliability, and a method of manufacturing the non-volatile memory device.

According to an aspect of the inventive concept, there is provided a non-volatile memory device having a vertical structure, the non-volatile memory device including: a first interlayer insulating layer on a substrate; a first gate electrode disposed on the first interlayer insulating layer; second interlayer insulating layers and second gate electrodes alternately stacked on the first gate electrode; an opening portion penetrating the first gate electrode, the second interlayer insulating layers, and the second gate electrodes and exposing the first interlayer insulating layer; a gate dielectric layer covering side walls and a bottom surface of the opening portion; and a channel region formed on the gate dielectric layer, and penetrating a bottom surface of the gate dielectric layer, and the first interlayer insulating layer, and thus electrically connected to the substrate, wherein a separation distance between side walls of the gate dielectric layer in a region of the gate dielectric layer which contacts the first gate electrode is greater than that in a region of the gate dielectric layer which contacts one of the second gate electrodes.

The gate dielectric layer contacts a top surface of the first interlayer insulating layer.

A separation distance between side walls of the gate dielectric layer in a region of the gate dielectric layer which contacts the first interlayer insulating layer is greater than that in a region of the gate dielectric layer which contacts one of the second interlayer insulating layers.

The gate dielectric layer includes: a tunneling insulating layer which contacts the channel region, a charge storage layer which contacts the tunneling insulating layer, and a first blocking insulating layer between the first gate electrode or the second gate electrodes and the charge storage layer.

The non-volatile memory device further includes a second blocking insulating layer which contacts the first blocking insulating layer in a region between two adjacent interlayer insulating layers from among the first interlayer insulating layer and the second interlayer insulating layers.

The gate dielectric layer has a bulb-type cross-section structure.

The first interlayer insulating layer is thinner than each of the second interlayer insulating layers.

The first interlayer insulating layer includes a middle temperature oxide (MTO) layer.

The first gate electrode is thicker than each of the second gate electrodes.

The channel region includes: a first channel layer formed on the gate dielectric layer, and a second channel layer formed on the first channel layer, wherein the second channel layer penetrates a bottom surface of the first channel layer, a bottom surface of the gate dielectric layer, and the first interlayer insulating layer, and is connected to the substrate.

According to another aspect of the inventive concept, there is provided a non-volatile memory device having a vertical structure, the non-volatile memory device including: a first interlayer insulating layer on a substrate; a first gate electrode disposed on the first interlayer insulating layer; second interlayer insulating layers and second gate electrodes alternately stacked on the first gate electrode; a plurality of memory cell strings spaced apart from each other in a first direction parallel to a top surface of the substrate, wherein each of the memory cell strings penetrates the first gate electrode, the second interlayer insulating layers, and the second gate electrodes and vertically extends on the substrate; and a common source line structure penetrating the first gate electrode, the second interlayer insulating layers, and the second gate electrodes and extending in the first direction between memory cell strings that are adjacent to each other in a second direction perpendicular to the first direction from among the plurality of memory cell strings, wherein a width of each of the plurality of memory cell strings in the first direction in a region of the memory cell string which contacts the first gate electrode is greater than that in a region of the memory cell string which contacts one of the second gate electrodes.

The common source line structure includes: a common source line which penetrates the first interlayer insulating layer and is connected to the substrate; and a common source line spacer disposed on side walls of the common source line and positioned between the common source line and the first gate electrode or the second gate electrodes.

A bottom surface of the common source line spacer contacts a top surface of the first interlayer insulating layer.

A bottom surface of the common source line is located at a lower level than a bottom surface of the common source line spacer.

The substrate includes an impurity region in a recess of the top surface of the substrate, the common source line contacts the impurity region, and the common source line spacer is spaced apart from the impurity region.

The impurity region includes a first impurity region and a second impurity region, in which the second impurity region is located at the center and contacts the common source line, while the first impurity region surrounds the second impurity region, and the impurity concentration of the first impurity region is smaller than that of the second impurity region.

A width of each of the plurality of memory cell strings in a region of the memory cell string which contacts a top surface of the first interlayer insulating layer is greater than that in a region of the memory cell string which contacts one of the second interlayer insulating layers.

Each of the plurality of memory cell strings has a bulb-type cross-section structure.

Each of the plurality of memory cell strings includes: a filling insulating layer located at center of each of the plurality of memory cell strings; a channel region disposed on side walls and bottom of the filling insulating layer; and a gate dielectric layer disposed on side walls and some bottom portion of the channel region, in which the gate dielectric layer contacts a top surface of the first interlayer insulating layer, and the channel region penetrates the gate dielectric layer and the first interlayer insulating layer vertically on the substrate and is electrically connected to the substrate.

A ground selection transistor, a plurality of memory cell transistors, and a string selection transistor are disposed along side walls of the gate dielectric layer in a third direction which is perpendicular to the first and second directions.

According to yet another aspect of the inventive concept, there is provided a non-volatile memory device having a vertical structure, the non-volatile memory device including: a first interlayer insulating layer on a substrate; a first gate electrode disposed on the first interlayer insulating layer; second interlayer insulating layers and second gate electrodes alternately stacked on the first gate electrode; and a plurality of memory cell strings spaced apart from each other in a first direction parallel to a top surface of the substrate, wherein each of the memory cell strings penetrates the first gate electrode, the second interlayer insulating layers, and the second gate electrodes and vertically extends on the substrate, wherein a width of each of the plurality of memory cell strings in a region of the memory cell string which contacts a top surface of the first interlayer insulating layer is greater than that in a region of the memory cell string which contacts one of the second interlayer insulating layers.

BRIEF DESCRIPTION OF THE DRAWINGS

Exemplary embodiments of the inventive concept will be more clearly understood from the following detailed description taken in conjunction with the appended drawings, and in which.

Figure 1:
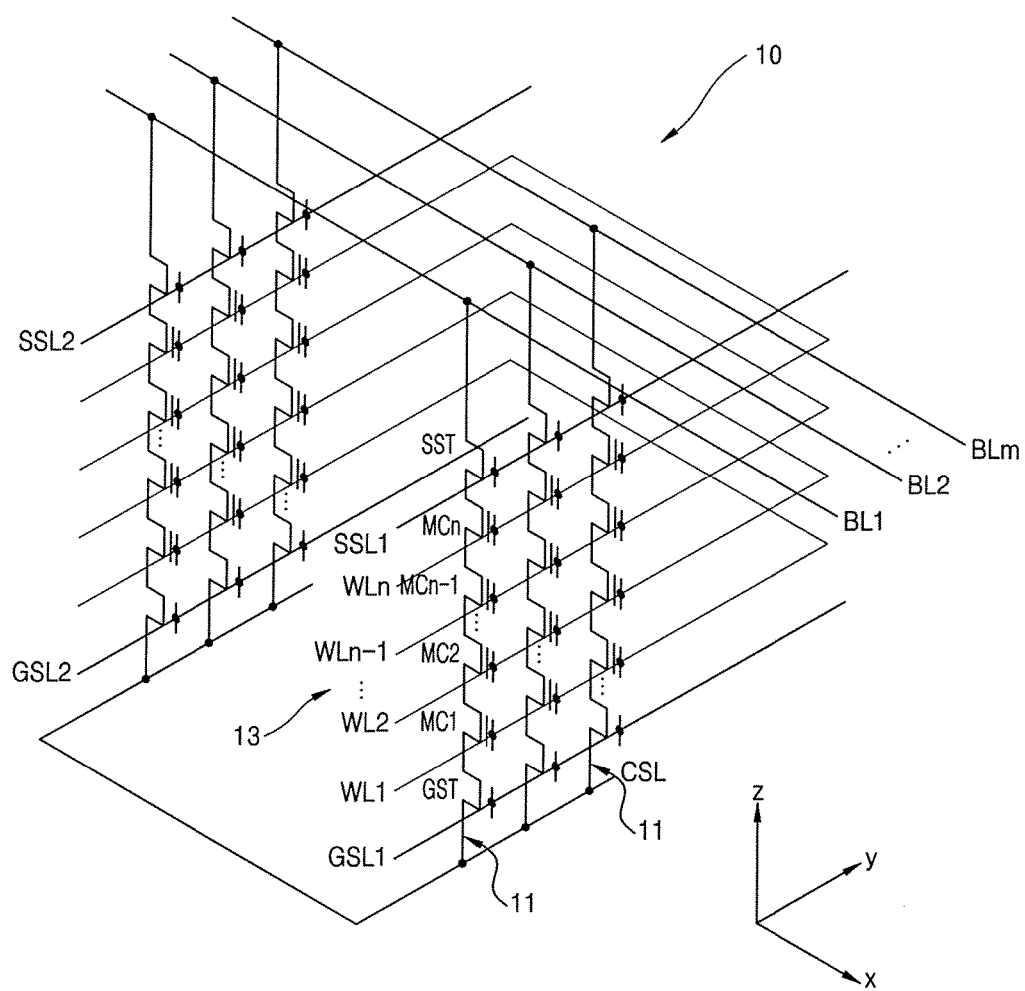
FIG. 1 illustrates an equivalent circuit of a memory cell array of a non-volatile memory device having a vertical structure according to an exemplary embodiment of the inventive concept, and more particularly, illustrates an equivalent circuit diagram of a NAND flash memory device having a vertical structure including a vertical channel structure according to an exemplary embodiment of the inventive concept.

Since the drawings in FIGS. 1-8 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Hereinafter, the inventive concept will now be described in detail with reference to the accompanying drawings, in which exemplary embodiments of the inventive concept are shown. In the drawings, the same elements are denoted by the same reference numerals and a repeated explanation thereof will not be given.

The inventive concept may, however, be embodied in many different forms and should not be construed as being limited to the exemplary embodiments set forth herein; rather, these exemplary embodiments are provided so that this disclosure will be thorough and complete, and will fully convey the concept of the inventive concept to one of ordinary skill in the art.

As used herein, the term "and/or" includes any and all combinations of one or more of the associated listed items. Expressions such as "at least one of", when preceding a list of elements, modify the entire list of elements and do not just modify the individual elements of the list. As used herein, the singular forms "a", "an" and "the" are intended to include the plural forms as well, unless the context clearly indicates otherwise.

It will be understood that, although the terms "first", "second", "third" etc. may be used herein to describe various members, regions, layers, portions, and/or elements, these members, regions, layers, portions, and/or elements should not be limited by these terms. These terms are only used to distinguish one member, region, layer, portion, or element from another member, region, layer, portion, or element. Thus, a first member, region, layer, portion, or element discussed below could be termed a second member, region, layer, portion, or element, or vice versa, without departing from the teachings of exemplary embodiments of the inventive concept. For example, a first element may be referred to as a second element, and likewise, a second element may be referred to as a first element without departing from the scope of the inventive concept.

All terms including technical and scientific terms used herein have meanings which can be generally understood by those of ordinary skill in the art, if the terms are not particularly defined. General terms defined by dictionaries should have meanings which can be contextually understood by any person skilled in the art and should not have ideally or excessively formal meanings, if the terms are not particularly defined herein by the exemplary embodiments of the inventive concept.

A specific process order in one embodiment may be changed in another embodiment. For example, two processes which are described as being continuously performed may be simultaneously performed or may be performed in a reverse order. As such, variations from the shapes of the illustrations caused from, for example, various manufacturing techniques and/or tolerances, are to be expected. Thus, exemplary embodiments of the inventive concept should not be construed as limited to the particular shapes of regions illustrated herein but may be to include deviations in shapes that result, for example, from manufacturing.

A non-volatile memory device according to one or more exemplary embodiments of the inventive concept may include a cell array region, a peripheral circuit region, a sense amplifier region, a decoding circuit region, and a connection region. In the cell array region, a plurality of memory cells, and bitlines and wordlines for electrical connection to the memory cells may be disposed. In the peripheral circuit region, circuits for driving the memory cells may be disposed, and in the sense amplifier region, circuits for reading information stored in the memory cells may be disposed. The connection region may be disposed between the cell array region and the decoding circuit region, and in the connection region, a wiring structure for electrically connecting the wordlines and the decoding circuit region may be disposed.

FIG. 1 illustrates an equivalent circuit of a memory cell array 10 of a non-volatile memory device having a vertical structure, according to an exemplary embodiment of the inventive concept, and more particularly, illustrates an equivalent circuit diagram of a NAND flash memory device having a vertical structure including a vertical channel structure.

Referring to FIG. 1, the memory cell array 10 may include a plurality of memory cell strings 11. Each of the memory cell strings 11 may have a vertical structure extending in a direction (z direction) perpendicular to a plane (x-y plane) that a top surface of a substrate forms. A memory cell block 13 may be formed by the memory cell strings 11.

Each of the memory cell strings 11 may include a plurality of memory cells MC1 to MCn, a string selection transistor SST, and a ground selection transistor GST. In each of the memory cell strings 11, the ground selection transistor GST, the memory cells MC1 to MCn, and the string selection transistor SST may be disposed in series in the vertical direction (z direction). In this regard, each of the memory cells MC1 to MCn may be used to store data. A plurality of wordlines WL1 to WLn may be coupled to the memory cells MC1 to MCn, respectively, thereby controlling the memory cells MC1 to MCn coupled thereto, respectively. The number of the memory cells MC1 to MCn may be changed according to the change in capacity of a semiconductor memory device.

A plurality of bitlines BL1 to BLm extending in the x direction may be connected to one side of each of the memory cell strings 11 arranged in first to m-th columns of the memory cell block 13, for example, a drain of the string selection transistor SST. Also, a common source line CSL may be connected to the other side of each of the memory cell strings 11, for example, a source of the ground selection transistor GST.

The wordlines WL1 to WLn extending in the y direction may be commonly connected to gates of the memory cells MC1 to MCn of the memory cell strings 11 arranged on the same layer. By driving the wordlines WL1 to WLn, data may be programmed on, read from, or erased from the memory cells MC1 to MCn.

In each of the memory cell strings 11, the string selection transistor SST may be arranged between the bitlines BL1 to BLm and the memory cells MC1 to MCn. In the memory cell block 13, each string selection transistor SST may control data transmission between the bitlines BL1 to BLm and the memory cells MC1 to MCn by using a string selection line SSL connected to a gate of each string selection transistor SST.

The ground selection transistor GST may be arranged between the memory cells MC1 to MCn and the common source line CSL. In the memory cell block 13, each ground selection transistor GST may control data transmission between the memory cells MC1 to MCn and the common source line CSL by using a ground selection line GSL connected to a gate of each ground selection transistor GST.

Figure 2A:
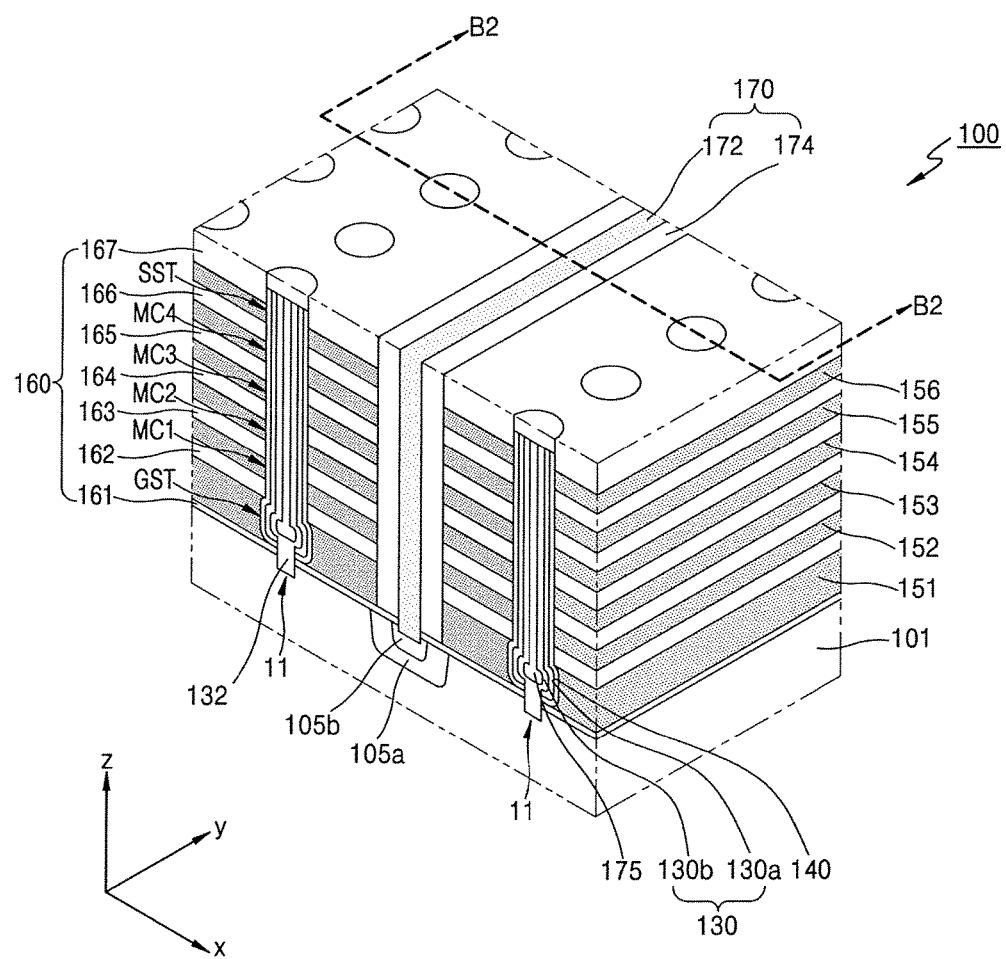
FIG. 2A is a perspective view of a non-volatile memory device according to an exemplary embodiment of the inventive concept.
Figure 2B:
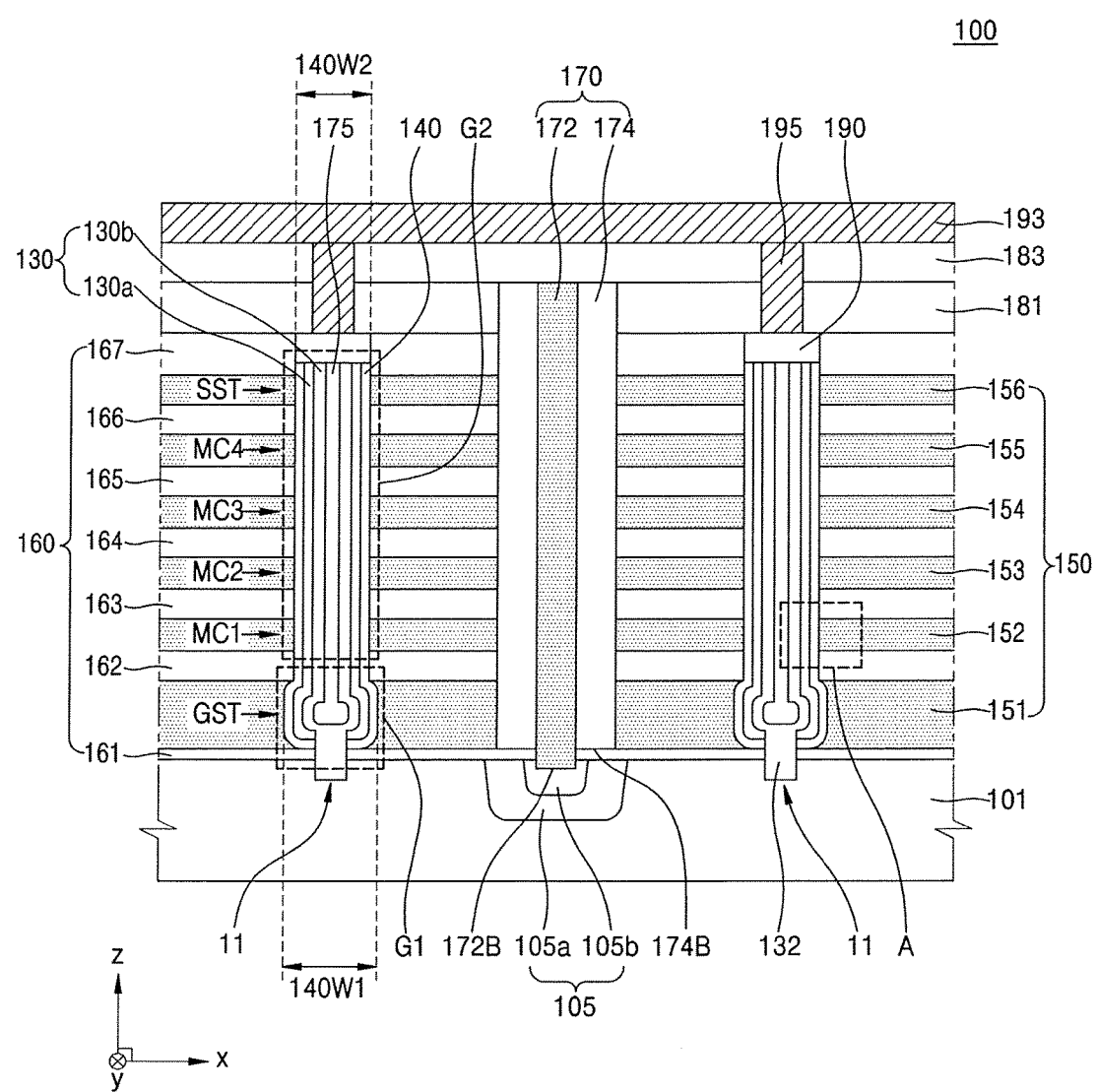
FIG. 2B is a cross-sectional view taken along line B2-B2 of FIG. 2A according to an exemplary embodiment of the inventive concept.

FIG. 2A is a perspective view of a non-volatile memory device 100 according to an exemplary embodiment of the inventive concept. FIG. 2B is a cross-sectional view taken along line B2-B2 of FIG. 2A.

To illustrate a structure of a plurality of memory cell strings three-dimensionally, some elements illustrated in FIG. 2B, such as a bitline 193 and a bitline contact plug 195, are omitted in FIG. 2A.

Referring to FIGS. 2A and 2B, the non-volatile memory device 100 may include the memory cell strings 11, a plurality of gate electrodes 150, a plurality of insulating layers 160, 181, and 183, a common source line structure 170, the bitline 193, and the bitline contact plug 195 on a substrate 101.

The substrate 101 may include, for example, a silicon substrate, a germanium substrate, a silicon-germanium substrate, a silicon-on-insulator (SOI) substrate, a germanium-on-insulator (GeOI) substrate, or the like. A p-well may be further formed on the substrate 101. The substrate 101 may have a main surface extending in both x and y directions (x-y plane).

The memory cell strings 11, as illustrated in FIG. 2A, may be separate from each other in a zigzag form. That is, the memory cell strings 11 separate from each other in the y direction may be offset in the x direction. Also, although, in the present exemplary embodiment of the inventive concept, the memory cell strings 11 are offset for every two columns, arrangement of the memory cell strings 11 is not limited thereto, and the memory cell strings 11 may be arranged to have various structures. For example, the memory cell strings 11 may be disposed in one column in the y direction, or may be offset in the x direction for every three or more columns and disposed in a zigzag form. Further, a structure of the memory cell strings 11 is not limited to the zigzag form illustrated in FIG. 2A, and the memory cell strings 11 may be disposed in a matrix separate from each other side by side in the x direction and the y direction.

Each of the memory cell strings 11 may extend in a direction perpendicular to a top surface of the substrate 101 (in the z direction). Each of the memory cell strings 11 may include a channel region 130, a gate dielectric layer 140, a filling insulating layer 175, and the ground selection transistor GST, a plurality of memory cell transistors MC1, MC2, MC3, and MC4, and the string selection transistor SST, which are disposed along side walls of the gate dielectric layer 140. In some cases, each of the ground selection transistor GST and the string selection transistor SST may be two.

The channel region 130 having a pillar shape may extend in the z direction on the substrate 101. As illustrated in FIG. 2A, the channel region 130 may be annular. However, a shape of the channel region 130 is not limited thereto, and the channel region 130 may have a cylinder or rectangular prism form.

The channel region 130 may be electrically connected to the substrate 101 at the bottom of the channel region 130. For example, as illustrated in FIGS. 2A and 2B, the channel region 130 may include a contact portion 132 protruding from a lower surface of the channel region 130, and thus may be connected to the substrate 101 via the contact portion 132.

In an exemplary embodiment of the inventive concept, the channel region 130 may include a first channel layer 130a and a second channel layer 130b. The first channel layer 130a may cover the gate dielectric layer 140, and the second channel layer 130b may cover the first channel layer 130a. The gate dielectric layer 140 may surround the side walls and bottom of the first channel layer 130a as shown in FIGS. 2A and 2B.

In an exemplary embodiment of the inventive concept, the second channel layer 130b may include the contact portion 132 penetrating the first channel layer 130a, the gate dielectric layer 140 and a first interlayer insulating layer 161, and connected to the substrate 101.

Each of the first channel layer 130a and the second channel layer 130b may include, for example, a semiconductor material such as polysilicon or single crystalline silicon. The first channel layer 130a and the second channel layer 130b may include, but are not limited to, the same material.

In an exemplary embodiment of the inventive concept, each of the first channel layer 130a and the second channel layer 130b may include polysilicon doped with n-type impurities such as phosphorus (P), arsenic (As), or antimony (Sb) or p-type impurities such as aluminum (Al), boron (B), indium (In), or potassium (K). In an exemplary embodiment of the inventive concept, each of the first channel layer 130a and the second channel layer 130b may include polysilicon not doped with impurities.

A conductive layer 190 may be formed on the channel region 130, the gate dielectric layer 140 and the filling insulating layer 175, and electrically connected to the channel region 130. The conductive layer 190 may include, for example, doped polysilicon. The conductive layer 190 may act as a drain region of the string selection transistor SST.

The string selection transistors SST may be connected to the bitline 193 via the conductive layer 190 and the bitline contact plug 195. Also, ground selection transistors GST may be electrically connected to an impurity region 105.

The impurity region 105 may be formed in the main surface of the substrate 101 and may extend in the y direction. Although only one impurity region 105 is illustrated in FIGS. 2A and 2B, the impurity region 105 may be arranged for each gap between channel regions 130 next to each other in the x direction. In an exemplary embodiment of the inventive concept, the impurity region 105 may be a source region and may form PN junction with another region of the substrate 101. The impurity region 105 may include a second impurity region 105b adjacent to the main surface of the substrate 101 and located at the center, and a first impurity region 105a surrounding the second impurity region 105b. In an exemplary embodiment of the inventive concept, the first impurity region 105a may be a low impurity concentration region, and the second impurity region 105b may be a high impurity concentration region.

The common source line structure 170 may be formed on the impurity region 105. The common source line structure 170 may penetrate the plurality of gate electrodes 150 and the plurality of insulating layers 160, and extend in the y direction between memory cell strings 11 that are adjacent to each other in the x direction. In an exemplary embodiment of the inventive concept, the common source line structure 170 may include a common source line 172 and common source line spacers 174.

Although the memory cell strings 11 adjacent to each other in the present exemplary embodiment of the inventive concept are symmetrical to the common source line structure 170, arrangement of the memory cell strings 11 is not limited thereto. For example, the adjacent memory cell strings 11 may be asymmetrical with respect to the common source line structure 170.

The common source line 172 may be formed on the impurity region 105 of the substrate 101. For example, the common source line 172 may extend in the y direction on a portion of the impurity region 105. In some cases, the common source line 172 may be formed on the entire impurity region 105 in the y direction.

In an exemplary embodiment of the inventive concept, the common source line 172 may include metal, for example, tungsten (W), aluminum (Al), copper (Cu), titanium (Ti), tantalum (Ta), etc. In an exemplary embodiment of the inventive concept, the common source line 172 may include a conductive material, for example, polysilicon doped with impurities or metal silicide such as nickel silicide, titanium silicide, tungsten silicide, cobalt silicide, etc.

The common source line spacers 174 including an insulating material may be formed on both side walls of the common source line 172. The common source line spacers 174 may be formed on side walls of the gate electrodes 150, and may serve as a device isolation layer electrically insulating the gate electrodes 150 and the common source line 172.

In an exemplary embodiment of the inventive concept, the common source line 172 may contact the impurity region 105 of the substrate 101, and the common source line spacers 174 may be separate from the impurity region 105 of the substrate 101. That is, the common source line 172 may penetrate the first interlayer insulating layer 161 and may be connected to the substrate 101, and the common source line spacers 174 may contact a top surface of the first interlayer insulating layer 161. Accordingly, a bottom surface 172B of the common source line 172 may be located at a lower level than bottom surfaces 174B of the common source line spacers 174.

The gate electrodes 151 to 156 (150) may be separate from each other in the z direction along side surfaces of the channel region 130, and each of the gate electrodes 150 may extend in the y direction.

Each of the gate electrodes 150 may serve as gates of the ground selection transistor GST, the memory cell transistors MC1, MC2, MC3, and MC4, and the string selection transistor SST. The gate electrodes 150 may be commonly connected to each of the memory cell strings 11 adjacent to the gate electrodes 150. The gate electrode 156 of the string selection transistor SST may be connected to the string selection line SSL (refer to FIG. 1). The gate electrodes 152, 153, 154, and 155 of the memory cell transistors MC1, MC2, MC3, and MC4 may be connected to the wordlines WL 1 to WLn (refer to FIG. 1). The gate electrode 151 of the ground selection transistor GST may be connected to the ground selection line GSL (refer to FIG. 1). The first gate electrode 151 may be thicker than each of the other gate electrodes (second gate electrodes) 152 to 156.

The gate electrodes 150 may include a metallic layer, for example, tungsten (W). The gate electrodes 150 may further include a diffusion barrier, and the diffusion barrier may include, for example, tungsten nitride (WN), tantalum nitride (TaN), and/or titanium nitride (TiN).

The gate dielectric layer 140 may be disposed between the channel region 130 and the gate electrodes 150. In an exemplary embodiment of the inventive concept, the gate dielectric layer 140 may include, for example, one selected from an oxide-nitride-oxide (ONO) layer, an oxide-nitride-alumina (ONA) layer, and an oxide-nitride-oxide-alumina (ONOA) layer.

The gate dielectric layer 140 may include a tunneling insulating layer, a charge storage layer, and a blocking insulating layer, which are sequentially stacked on the channel region 130 in this stated order, and detailed descriptions thereof will be given later with reference to FIG. 3.

The interlayer insulating layers 161 to 167 (160) may be disposed between the gate electrodes 150. In a similar manner to the gate electrodes 150, the interlayer insulating layers 160 may be separate from each other in the z direction, and each of the interlayer insulating layers 160 may extend in the y direction. A side surface of each of the interlayer insulating layers 160 may contact the channel region 130. In an exemplary embodiment of the inventive concept, the interlayer insulating layers 160 may include silicon oxide or silicon nitride.

The first interlayer insulating layer 161, which is the lowermost layer of the interlayer insulating layers 160, may be very thin. The first interlayer insulating layer 161 may be thinner than each of the second interlayer insulating layers 162 to 167. The first interlayer insulating layer 161 may include a material which is the same as that of the second interlayer insulating layers 162 to 167 above the first interlayer insulating layer 161, or may include a material which is different from that of the second interlayer insulating layers 162 to 167.

In an exemplary embodiment of the inventive concept, the first interlayer insulating layer 161 may be a kind of buffer layer, may include a middle temperature oxide (MTO) layer, and may insulate the gate electrode 151 of the ground selection transistor GST from the substrate 101.

Thickness of each of the interlayer insulating layers 160 may have various modifications of the one illustrated in FIGS. 2A and 2B, and the number of layers included in the interlayer insulating layers 160 may also be variously modified.

An upper insulating layer 181 may be formed on the second interlayer insulating layer 167. A top surface of the upper insulating layer 181 may be located at substantially the same level as a top surface of the common source line 172.

A common source line buried insulating layer 183 covering at least a region of the top surface of the common source line 172 may be formed on the upper insulating layer 181. The common source line buried insulating layer 183 may be located between the common source line 172 extending in the y direction and the bitline 193 extending in the x direction above the common source line 172, and may serve as a device isolation layer electrically isolating the common source line 172 and the bitline 193.

In an exemplary embodiment of the inventive concept, the upper insulating layer 181 or the common source line buried insulating layer 183 may include a material which is the same as that of the interlayer insulating layers 160 or may include a material which is different from that of the interlayer insulating layers 160.

The bitline 193 extending in the x direction and including line patterns may be formed on the common source line buried insulating layer 183, and may be electrically connected to the conductive layer 190 via the bitline contact plug 195 penetrating the upper insulating layer 181 and the common source line buried insulating layer 183.

Although it is illustrated in FIGS. 2A and 2B that the memory cell transistors MC1, MC2, MC3, and MC4 are arranged as four, this is an example, and a larger or smaller number of memory cells may be arranged according to the capacity of the semiconductor memory device 100.

In an exemplary embodiment of the inventive concept, the string selection transistor SST and the ground selection transistor GST may have structures which are different from those of the memory cell transistors MC1, MC2, MC3, and MC4.

The channel region 130, the gate dielectric layer 140, and/or the filling insulating layer 175 in each of the memory cell strings 11 in the present exemplary embodiment of the inventive concept may have bulb-type cross-section structures as illustrated in FIG. 2B. For example, a separation distance 140W1 between side walls of the gate dielectric layer 140 in the x direction in a portion (region G1 of FIG. 2B) adjacent to the gate electrode 151 of the ground selection transistor GST may be greater than a separation distance 140W2 between side walls of the gate dielectric layer 140 in the x direction in a portion (region G2 of FIG. 2B) adjacent to the other gate electrodes 152, 153, 154, 155, and 156. That is, the width of each of the memory cell strings 11 in the x direction in a region which contacts the first gate electrode 151 may be greater than the width of each of the memory cell strings 11 in the x direction in a region which contacts the other gate electrodes 152, 153, 154, 155, and 156. When the memory cell strings 11 are circular columns as shown in FIG. 2B, the separation distance between the side walls of the gate dielectric layer 140 or the width of each of the memory cell strings 11 may be equivalent to the diameter of the circle.

When each of the memory cell strings 11 has the structure as described above, a good etching process margin in an etching process (refer to FIG. 6G) for forming the contact portion 132 of the channel region 130 may be sufficiently obtained.

Figure 3:
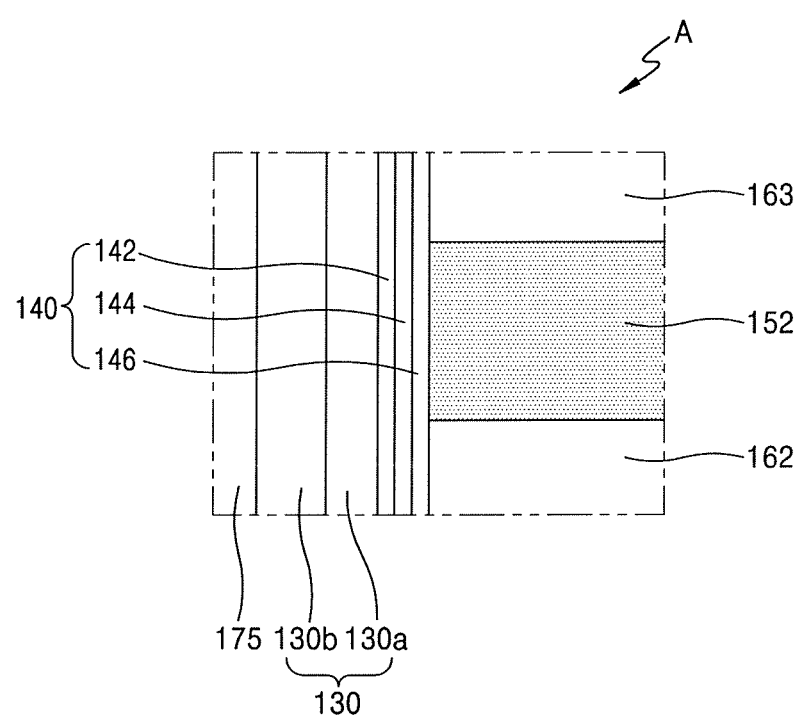
FIG. 3 is an enlarged view of region A of FIG. 2B according to an exemplary embodiment of the inventive concept.

FIG. 3 is an enlarged view of region A of FIG. 2B. In FIG. 3, elements that are the same as those in FIGS. 1 to 2B are designated by the same reference numerals, and a repeated description thereof is omitted for simplification.

In FIG. 3, the channel region 130, which may be used as a channel of each of the memory cell strings 11 (refer to FIG. 2B), is illustrated. The filling insulating layer 175 may be disposed on a left side surface of the channel region 130 illustrated in FIG. 3, that is, on a left side wall of the second channel layer 130b. The gate dielectric layer 140 may be disposed on a right side surface of the channel region 130, that is, on a right side wall of the first channel layer 130a.

The gate dielectric layer 140 may have a structure including a tunneling insulating layer 142, a charge storage layer 144, and a blocking insulating layer 146, which are sequentially stacked on the right side wall of the first channel layer 130a in this stated order. The first blocking insulating layer 146 may be between the charge storage layer 144 and the first gate electrode 151 or the second gate electrodes 152 to 156.

The tunneling insulating layer 142 may allow charges to tunnel to the charge storage layer 144 through the process of Fowler-Nordheim (F-N) tunneling. The tunneling insulating layer 142 may be a single layer or complex layer including, for example, one or more selected from silicon oxide ($SiO_x$), silicon nitride ($Si_xN_y$), silicon oxynitride (SiON), hafnium oxide ($HfO_x$), hafnium silicon oxide ($HfSi_xO_y$), aluminum oxide ($Al_xO_y$), and zirconium oxide ($ZrO_x$).

The charge storage layer 144 may be a charge trapping layer or a floating gate conductive layer. When the charge storage layer 144 is a floating gate conductive layer, the charge storage layer 144 may be formed by depositing polysilicon using chemical vapor deposition (CVD), for example, low pressure chemical vapor deposition (LPCVD) with $Si_2H_6$ and $PH_3$ gases. When the charge storage layer 144 is a charge trapping layer, the charge storage layer 144 may include one or more selected from silicon oxide ($SiO_x$), silicon nitride ($Si_xN_y$), silicon oxynitride (SiON), hafnium oxide ($HfO_x$), zirconium oxide ($ZrO_x$), tantalum oxide ($Ta_xO_y$), titanium oxide ($TiO_x$), hafnium aluminum oxide ($HfAl_xO_y$), hafnium tantalum oxide ($HfTa_xO_y$), hafnium silicon oxide ($HfSi_xO_y$), aluminum nitride ($Al_xN_y$), and aluminum gallium nitride ($AlGa_xN_y$).

In an exemplary embodiment of the inventive concept, the charge storage layer 144 may include quantum dots or nano crystals. In this regard, the quantum dots or the nano crystals may include a conductor such as particles of metal or semiconductor.

The blocking insulating layer 146 may include one or more selected from silicon oxide, silicon nitride, silicon oxynitride, and a high-k dielectric material. The high-k dielectric material may refer to a dielectric material having a higher dielectric constant than that of an oxide layer.

In an exemplary embodiment of the inventive concept, the blocking insulating layer 146 may be a material having a dielectric constant higher than that of the tunneling insulating layer 142. For example, the blocking insulating layer 146 may include at least one of aluminum oxide ($Al_xO_y$), tantalum oxide ($Ta_xO_y$), titanium oxide ($TiO_x$), yttrium oxide ($Y_xO_y$), zirconium oxide ($ZrO_x$), zirconium silicon oxide ($ZrSi_xO_y$), hafnium oxide ($HfO_x$), hafnium silicon oxide ($HfSi_xO_y$), lanthanum oxide ($La_xO_y$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_xO_y$).

The gate electrode 152 may be disposed on a right side surface of the gate dielectric layer 140. Interlayer insulating layers 162 and 163 may be disposed, respectively, on and under the gate electrode 152.

Figure 4:
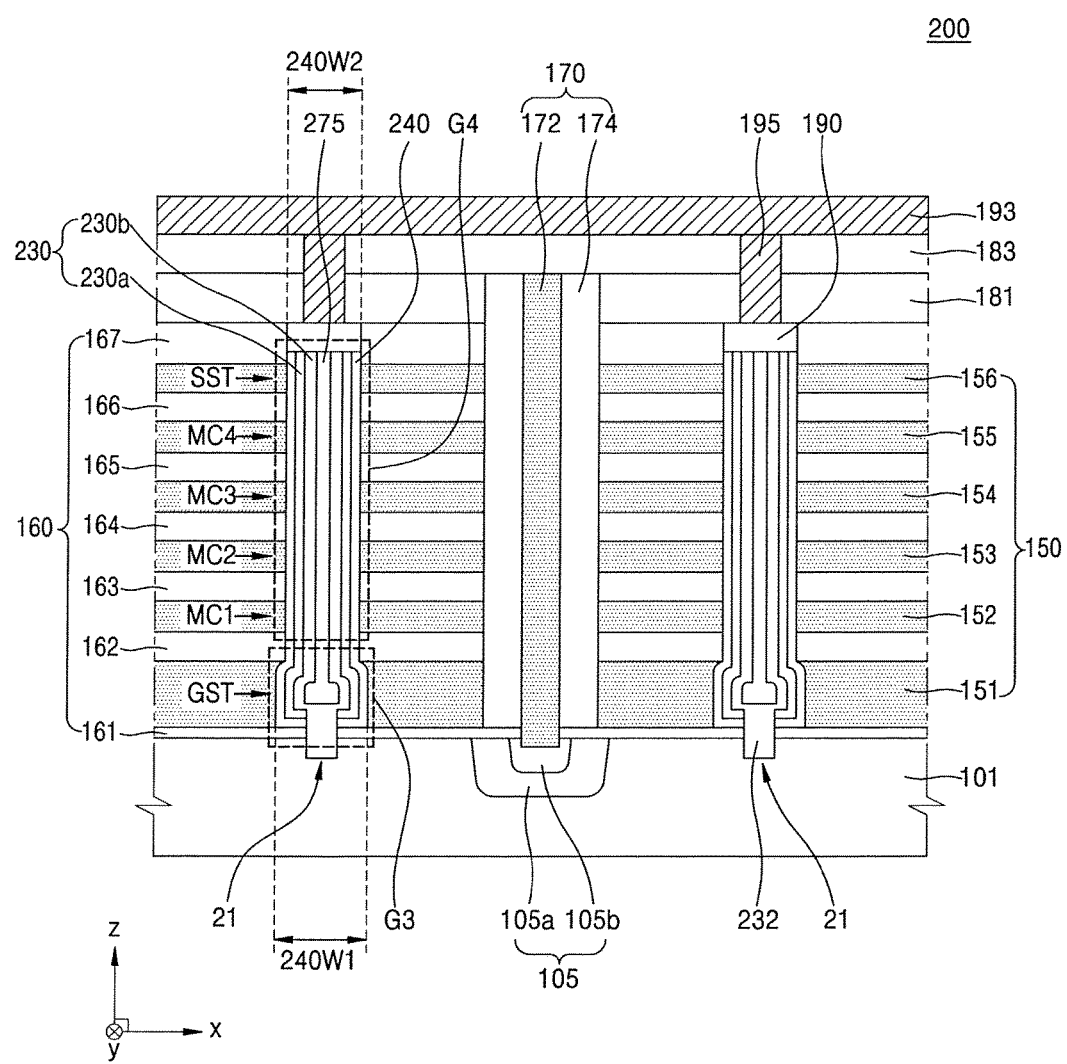
FIG. 4 is a cross-sectional view of a non-volatile memory device with slightly different structure in memory cell strings according to an exemplary embodiment of the inventive concept.

FIG. 4 is a cross-sectional view of a non-volatile memory device 200 according to an exemplary embodiment of the inventive concept. In FIG. 4, elements that are the same as those in FIGS. 1 to 3 are designated by the same reference numerals, and a repeated description thereof is omitted for simplification.

Referring to FIG. 4, the non-volatile memory device 200 may include a plurality of memory cell strings 21, the gate electrodes 150, the insulating layers 160, 181, and 183, the common source line structure 170, the bitline 193, and the bitline contact plug 195 on the substrate 101.

The non-volatile memory device 200 may have a structure substantially the same as or similar to the structure of the non-volatile memory device 100 described with reference to FIGS. 2A and 2B, except the structure of the memory cell strings 21 shown in the cross-sectional view. Hereinafter, structural differences of the memory cell strings 21 will be mainly described for simplification.

Each of the memory cell strings 21 may include a channel region 230, a gate dielectric layer 240, and a filling insulating layer 275; and the ground selection transistor GST, the memory cell transistors MC1, MC2, MC3, and MC4, and the string selection transistor SST are disposed along side walls of the gate dielectric layer 240.

The channel region 230 and/or the gate dielectric layer 240 in each of the memory cell strings 21 in a portion (region G3 of FIG. 4) of the ground selection transistor GST, that is adjacent to the gate electrode 151, may have a structure in which a separation distance between lower side walls is greater than that between upper side walls. For example, a separation distance 240W1 between side walls of the gate dielectric layer 240 in the x direction in a portion adjacent to or contacting the first interlayer insulating layer 161 may be greater than a separation distance 240W2 between side walls of the gate dielectric layer 240 in the x direction in a portion adjacent to or contacting the second interlayer insulating layer 162. Accordingly, a good etching process margin in an etching process (refer to FIG. 6G) for forming a contact portion 232 of the channel region 230 may be sufficiently obtained.

Figure 5A:
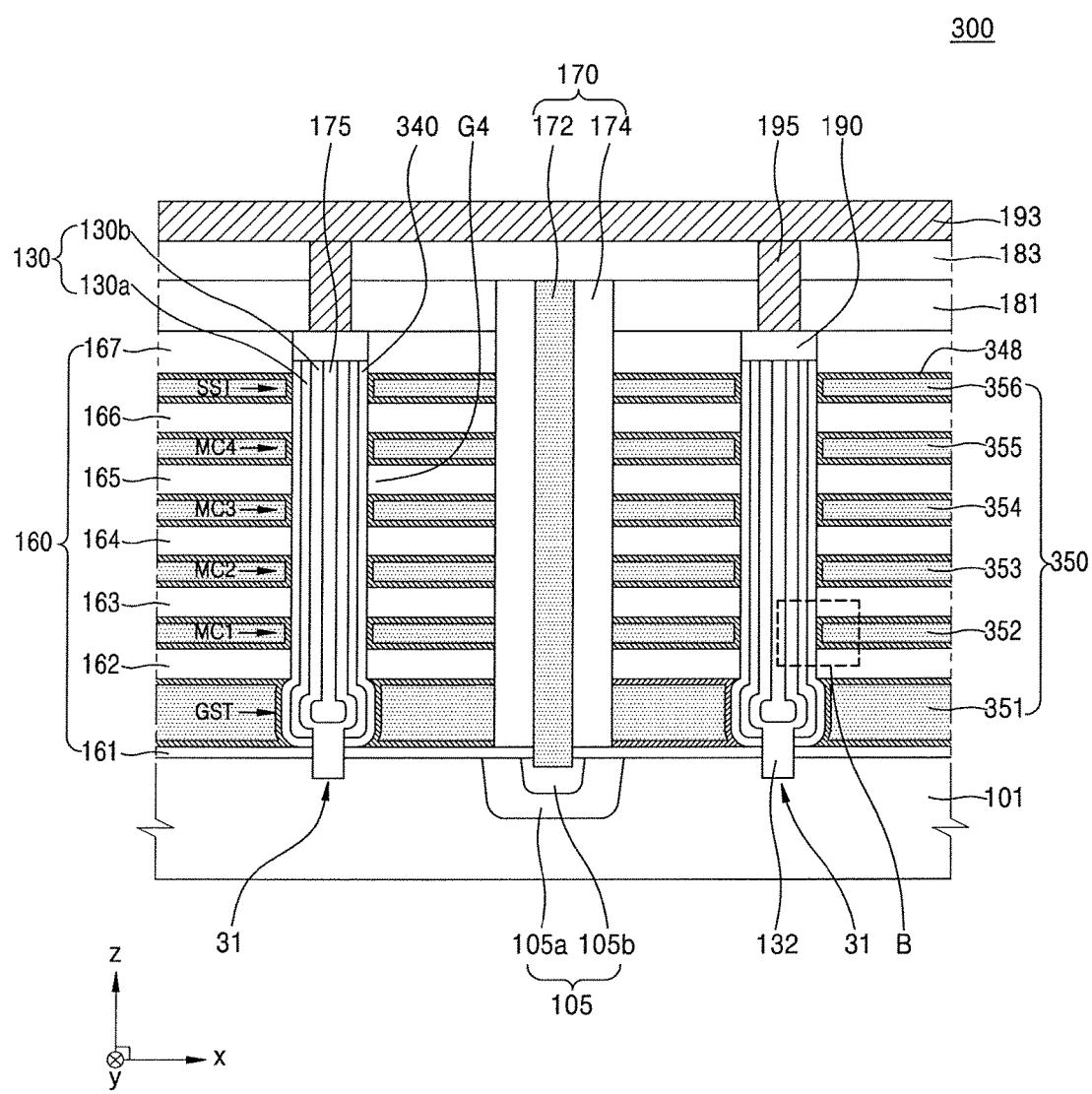
FIG. 5A is a cross-sectional view of a non-volatile memory device including a second blocking insulating layer according to an exemplary embodiment of the inventive concept.
Figure 5B:
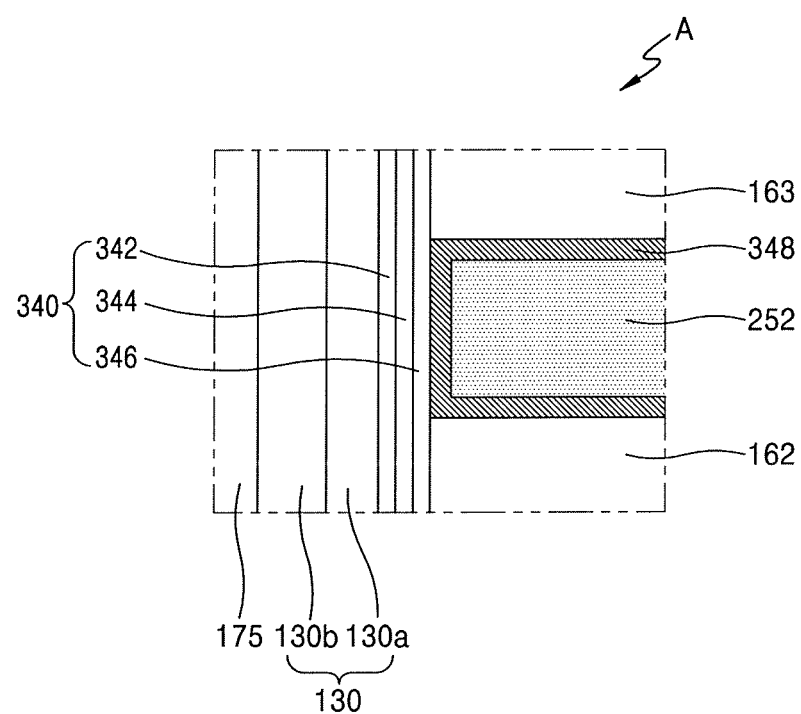
FIG. 5B is an enlarged view of region B of FIG. 5A according to an exemplary embodiment of the inventive concept.

FIG. 5A is a cross-sectional view of a non-volatile memory device 300 according to an exemplary embodiment of the inventive concept. FIG. 5B is an enlarged view of region B of FIG. 5A. In FIGS. 5A and 5B, elements that are the same as those in FIGS. 1 to 4 are designated by the same reference numerals, and a repeated description thereof is omitted for simplification.

Referring to FIGS. 5A and 5B, the non-volatile memory device 300 may include a plurality of memory cell strings 31 including a first blocking insulating layer 346, a second blocking insulating layer 348, a plurality of gate electrodes 350, the insulating layers 160, 181, and 183, the common source line structure 170, the bitline 193, and the bitline contact plug 195.

The non-volatile memory device 300 may have a structure substantially the same as or similar to the structure of the non-volatile memory device 100 described with reference to FIGS. 2A and 2B, except that the non-volatile memory device 300 further includes the second blocking insulating layer 348. Hereinafter, the second blocking insulating layer 348 will be mainly described for simplification.

A gate dielectric layer 340 may have a structure including a tunneling insulating layer 342, a charge storage layer 344, and the first blocking insulating layer 346, which are sequentially stacked on the right side wall of the first channel layer 130a in this stated order. The tunneling insulating layer 342, the charge storage layer 344, and the first blocking insulating layer 346 may have structures substantially the same as or similar to the structures of the tunneling insulating layer 142, the charge storage layer 144, and the blocking insulating layer 146, respectively, which have been described with reference to FIGS. 2A and 2B.

The second blocking insulating layer 348 may contact a side wall of the first blocking insulating layer 346 in each region between the interlayer insulating layers 161 to 167 (160). That is, the second blocking insulating layer 348 may cover lateral opening portions T1 and T2 (refer to FIG. 7B) defined between the interlayer insulating layers 160. In an exemplary embodiment of the inventive concept, the second blocking insulating layer 348 may include a material which is the same as that of the first blocking insulating layer 346, but is not limited thereto.

The lateral opening portions T1 and T2 after the second blocking insulating layer 348 is formed may be filled with the gate electrodes 351 to 356 (350). The gate electrodes 350 may have a structure substantially the same as or similar to the structure of the gate electrodes 150 described with reference to FIGS. 2A and 2B, except that the gate electrodes 350 contact the second blocking insulating layer 348.

In the case where the second blocking insulating layer 348 contacting the side wall of the first blocking insulating layer 346 is additionally formed as in the present exemplary embodiment of the inventive concept, although a portion of the first blocking insulating layer 346 is damaged in a pullback etching process for forming the lateral opening portions T1 and T2, which will be described later with reference to FIGS. 6M and 6N, the damaged portion may be repaired by the second blocking insulating layer 348.

Figure 6A:
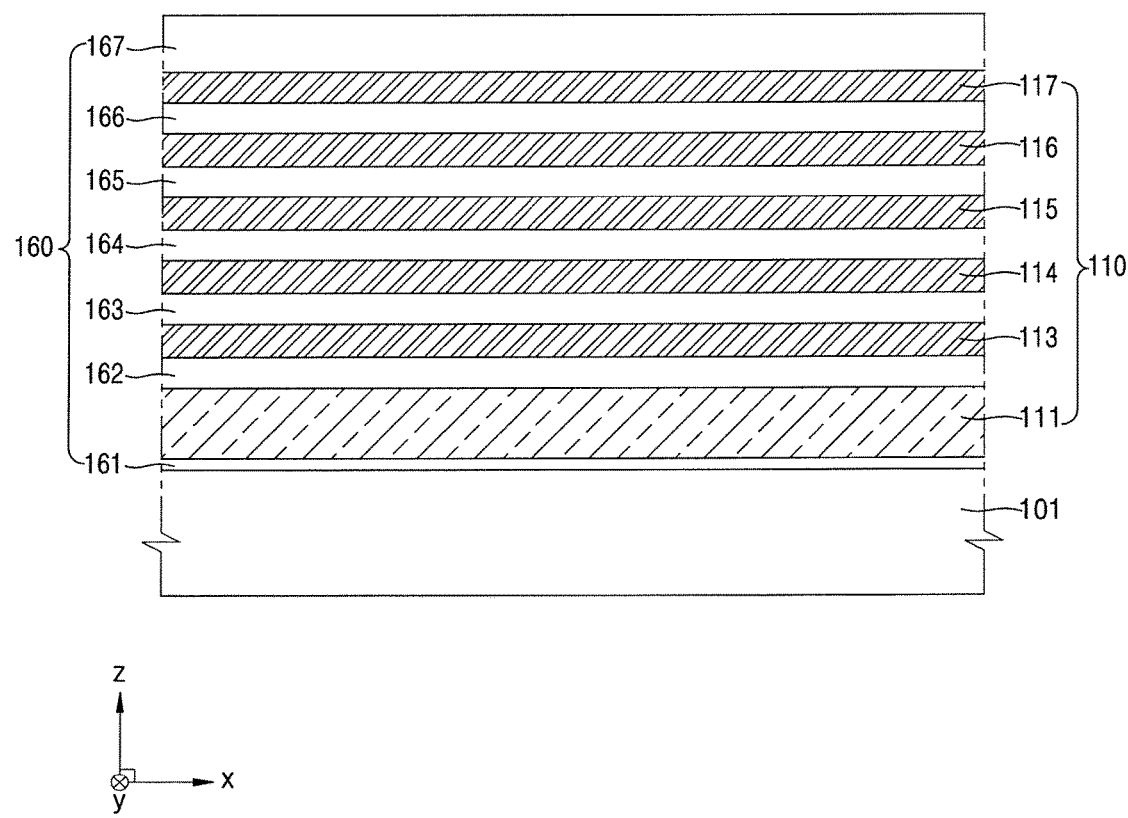
FIGS. 6A to 6U are cross-sectional views illustrated according to a process sequence in order to describe a method of manufacturing a non-volatile memory device, according to an exemplary embodiment of the inventive concept.
Figure 6B:
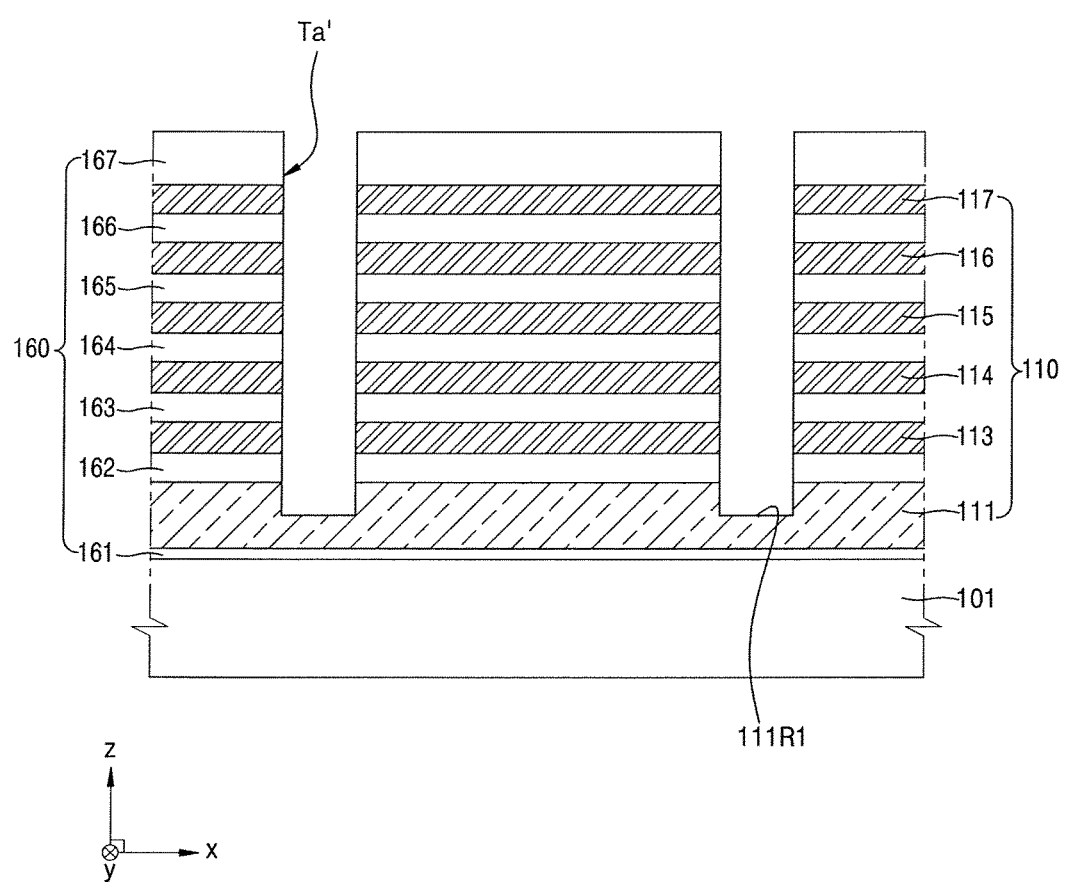
Figure 6C:
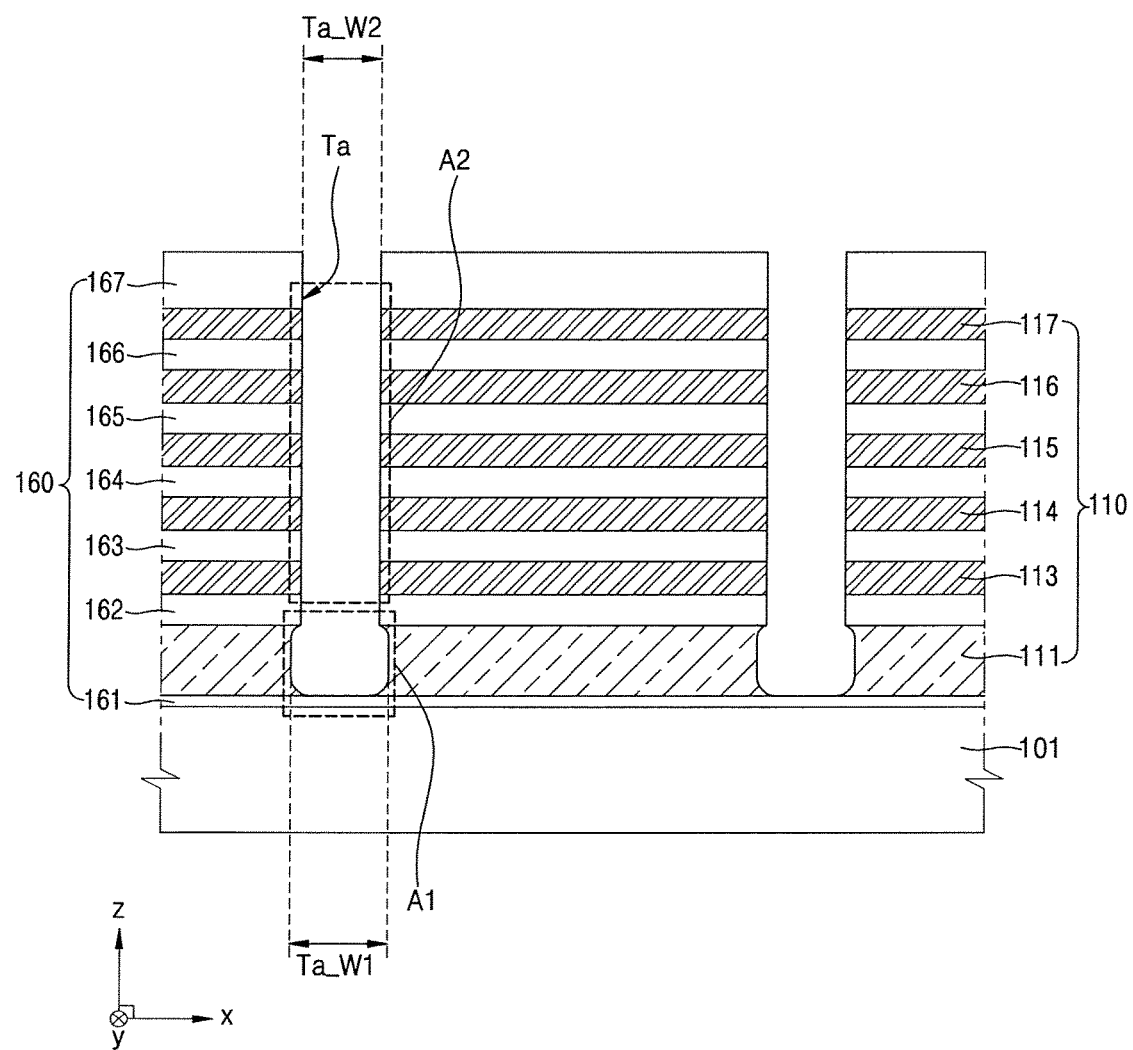
Figure 6D:
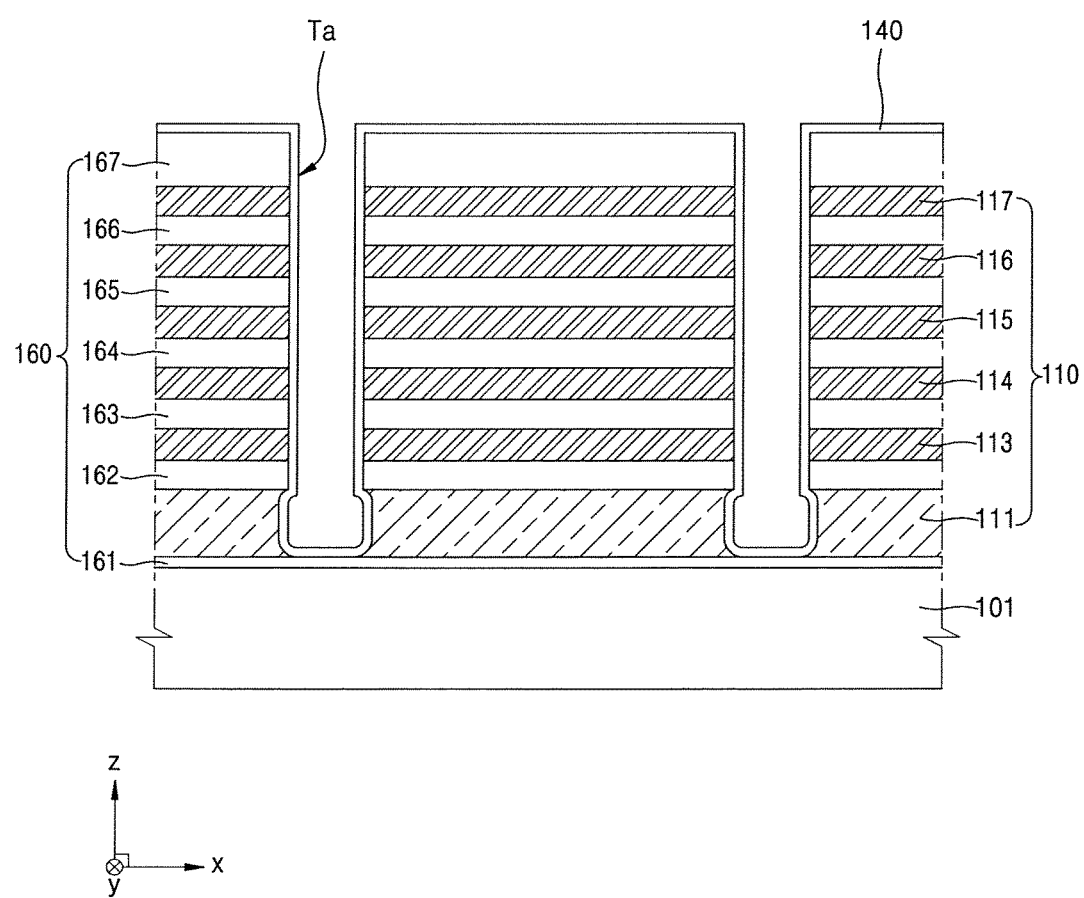
Figure 6E:
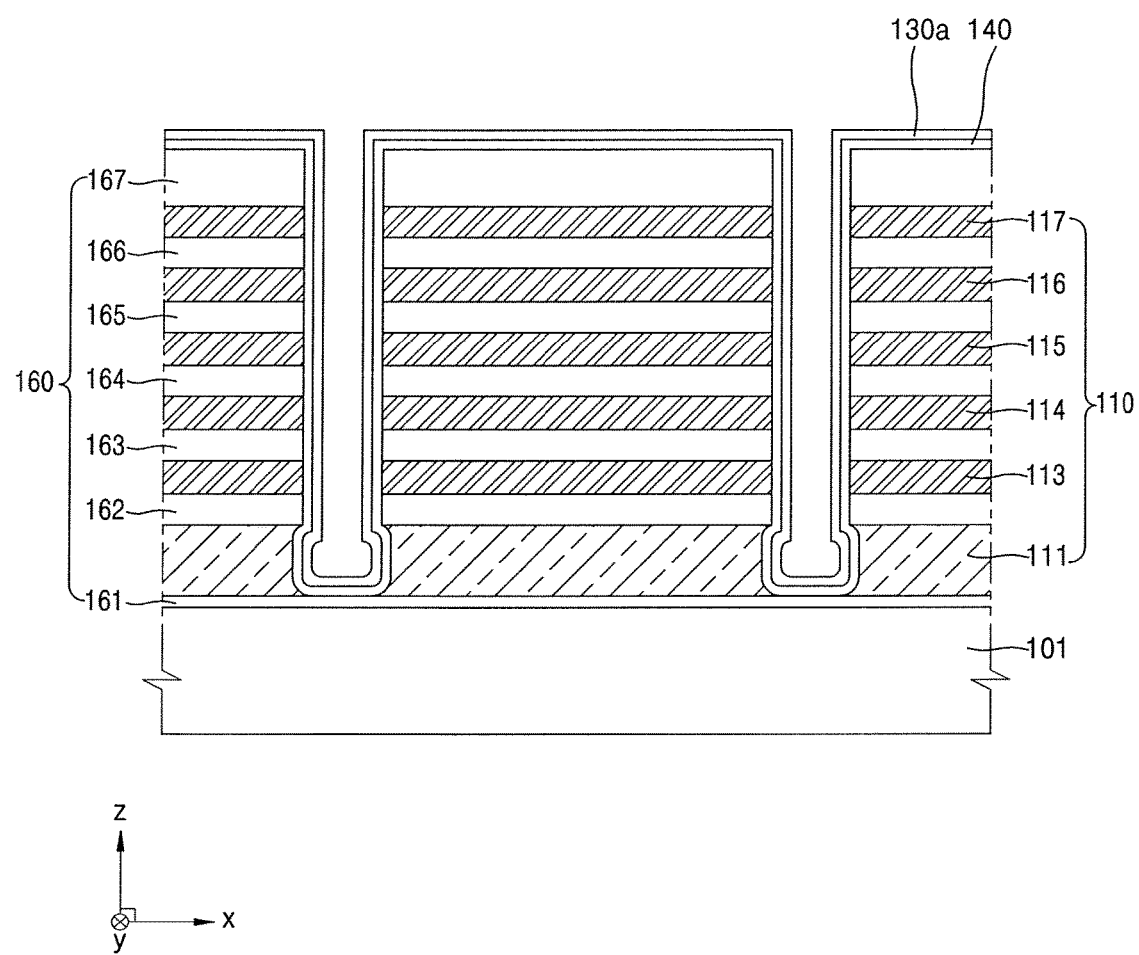
Figure 6F:
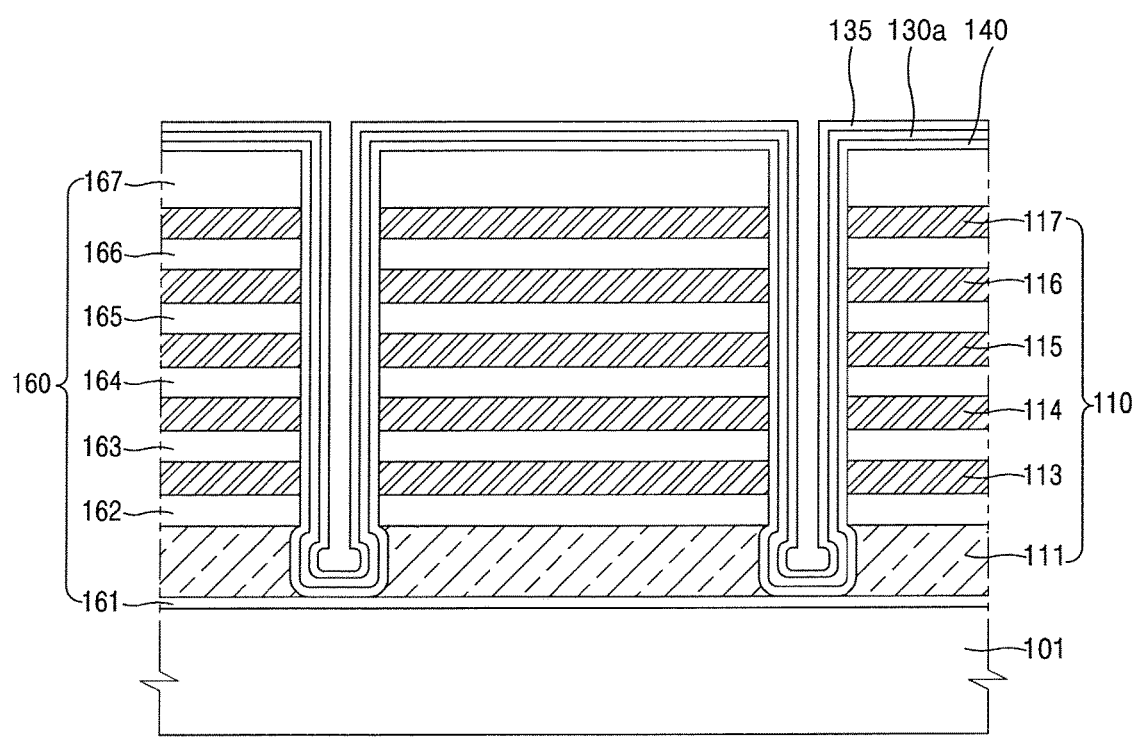
Figure 6G:
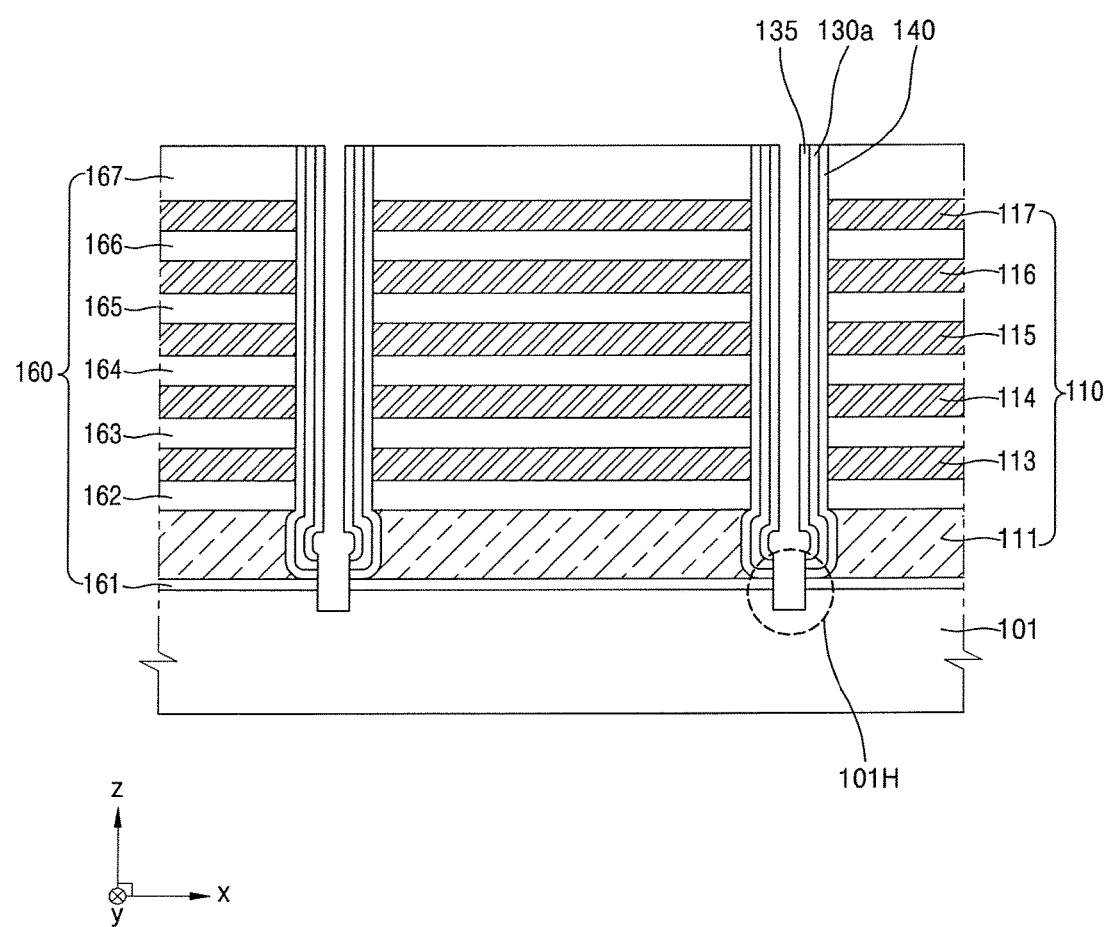
Figure 6H:
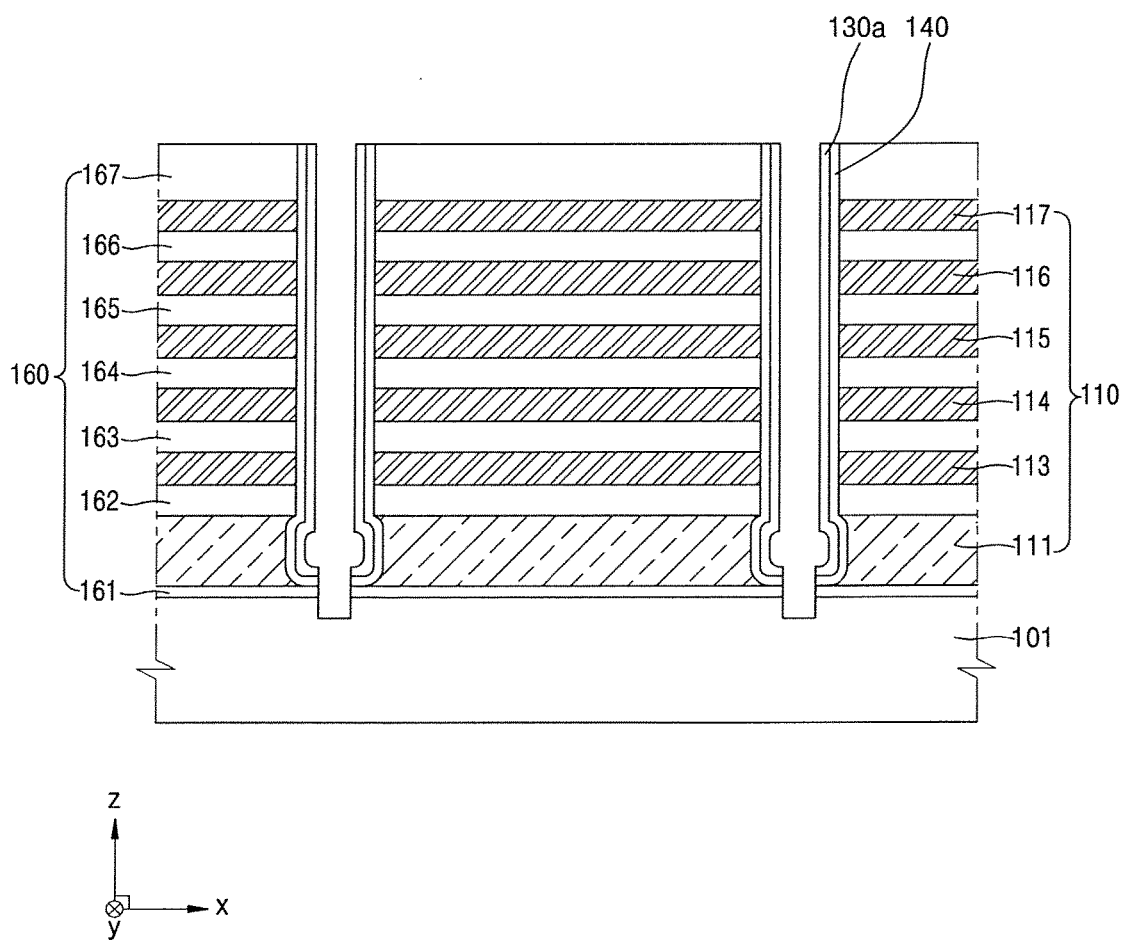
Figure 6I:
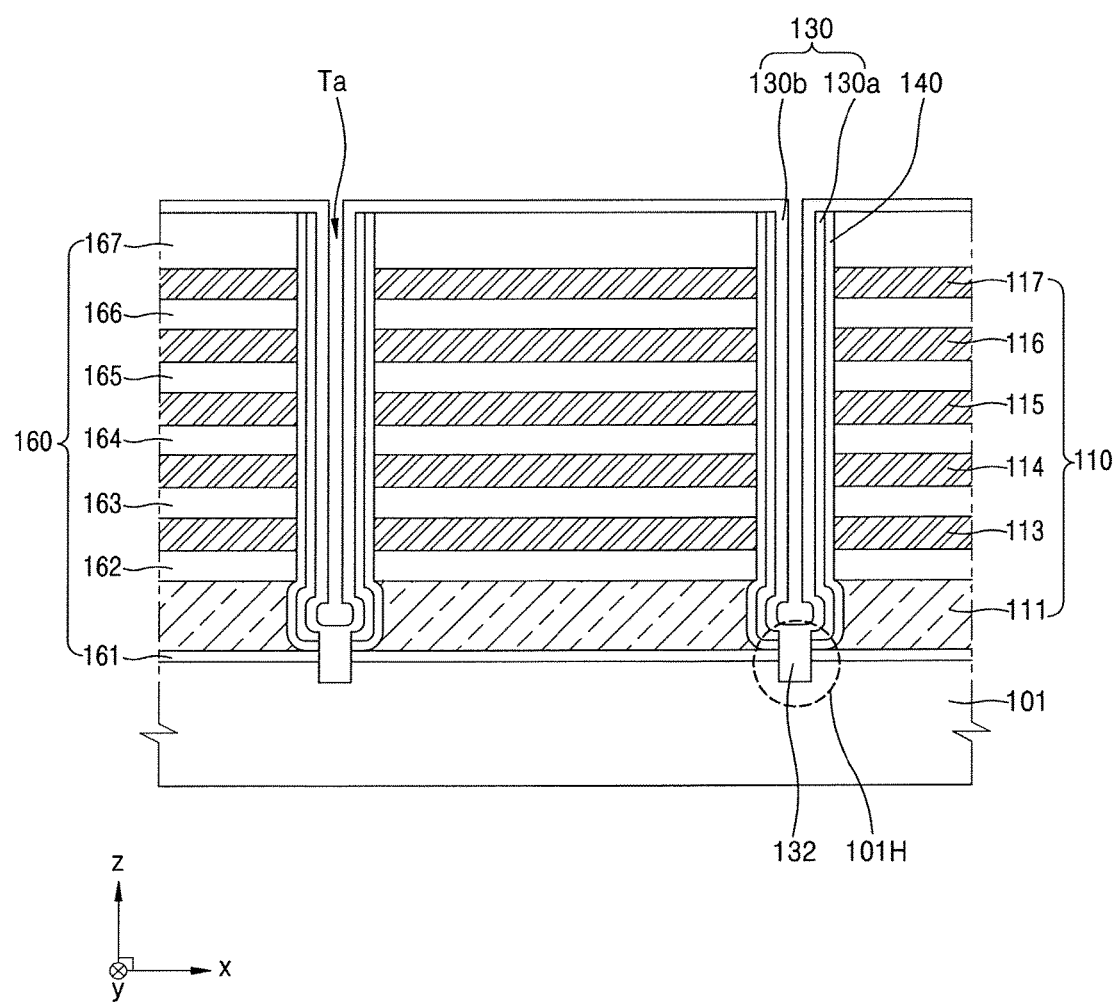
Figure 6J:
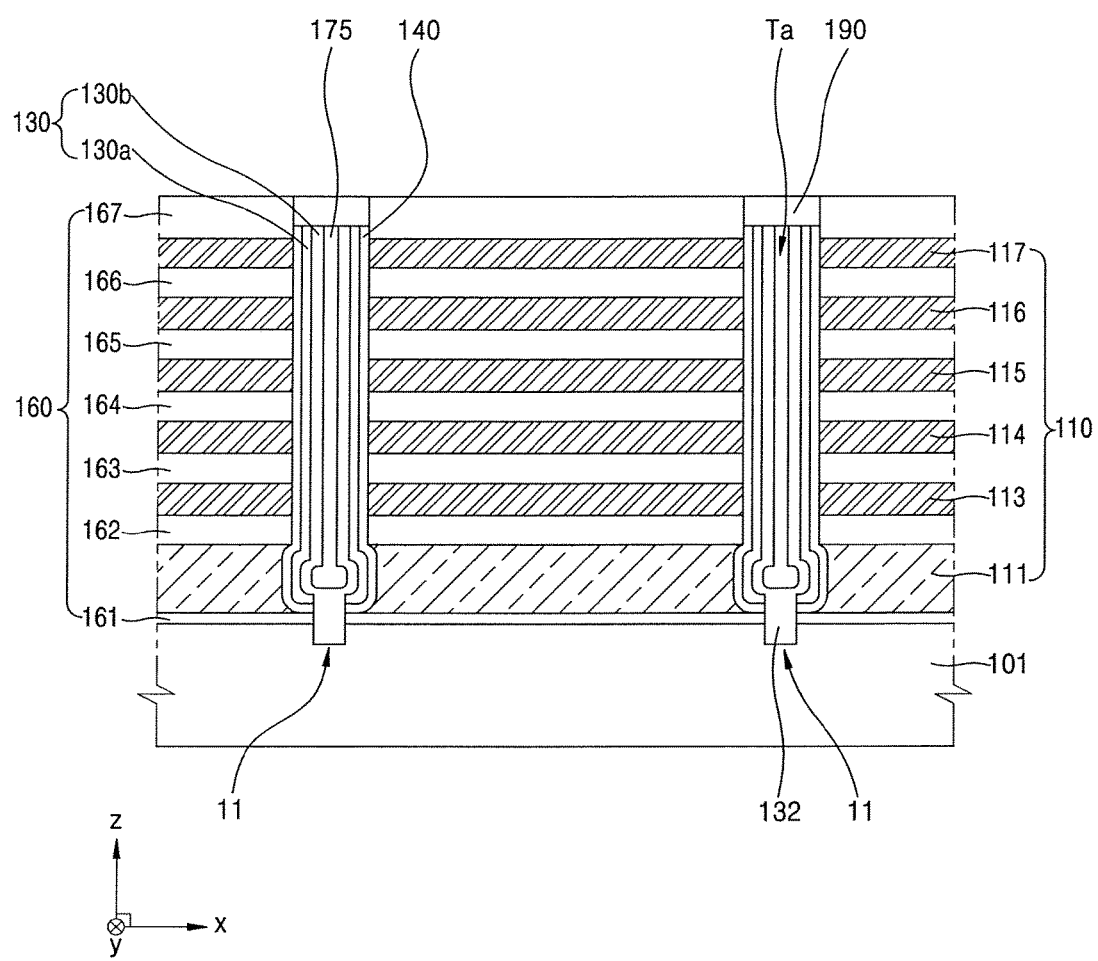
Figure 6K:
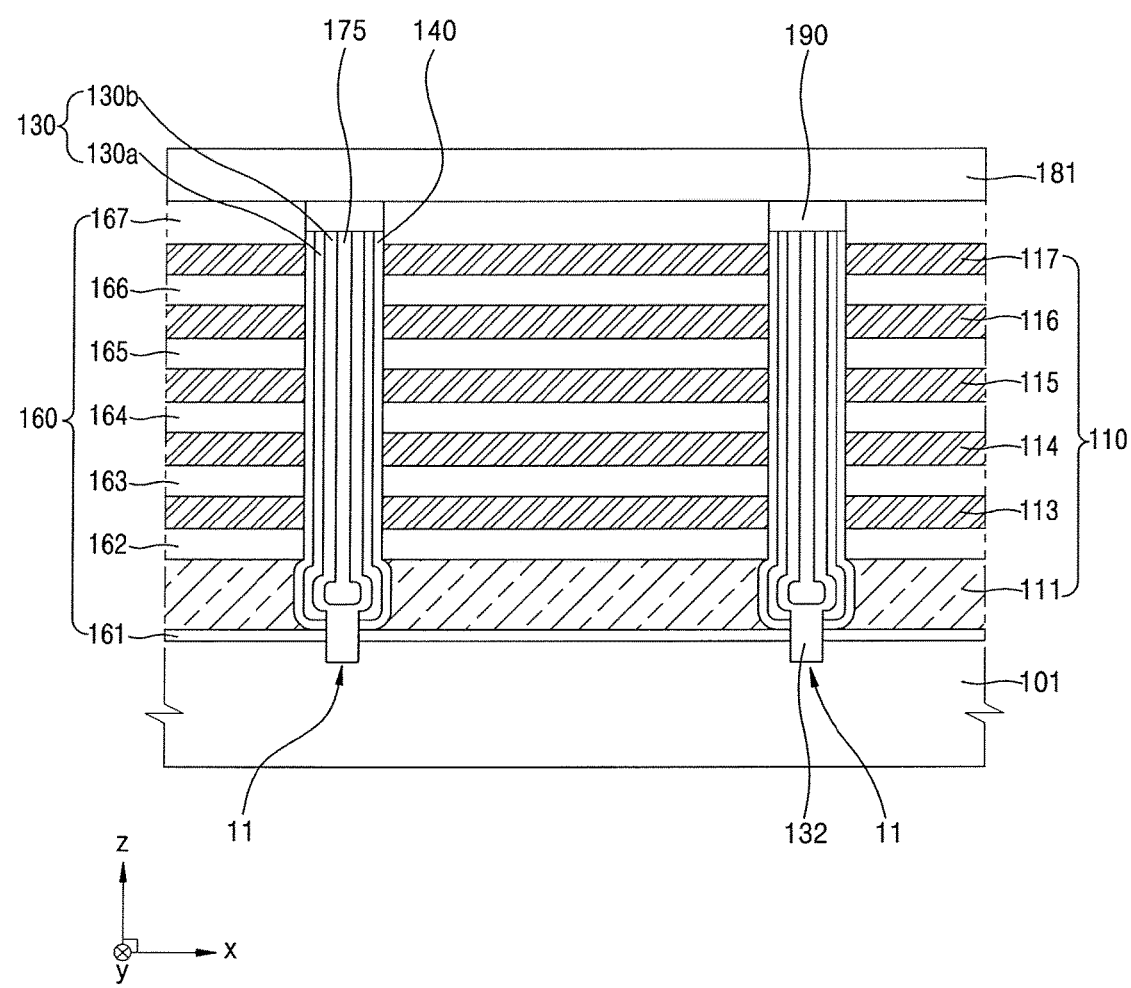
Figure 6L:
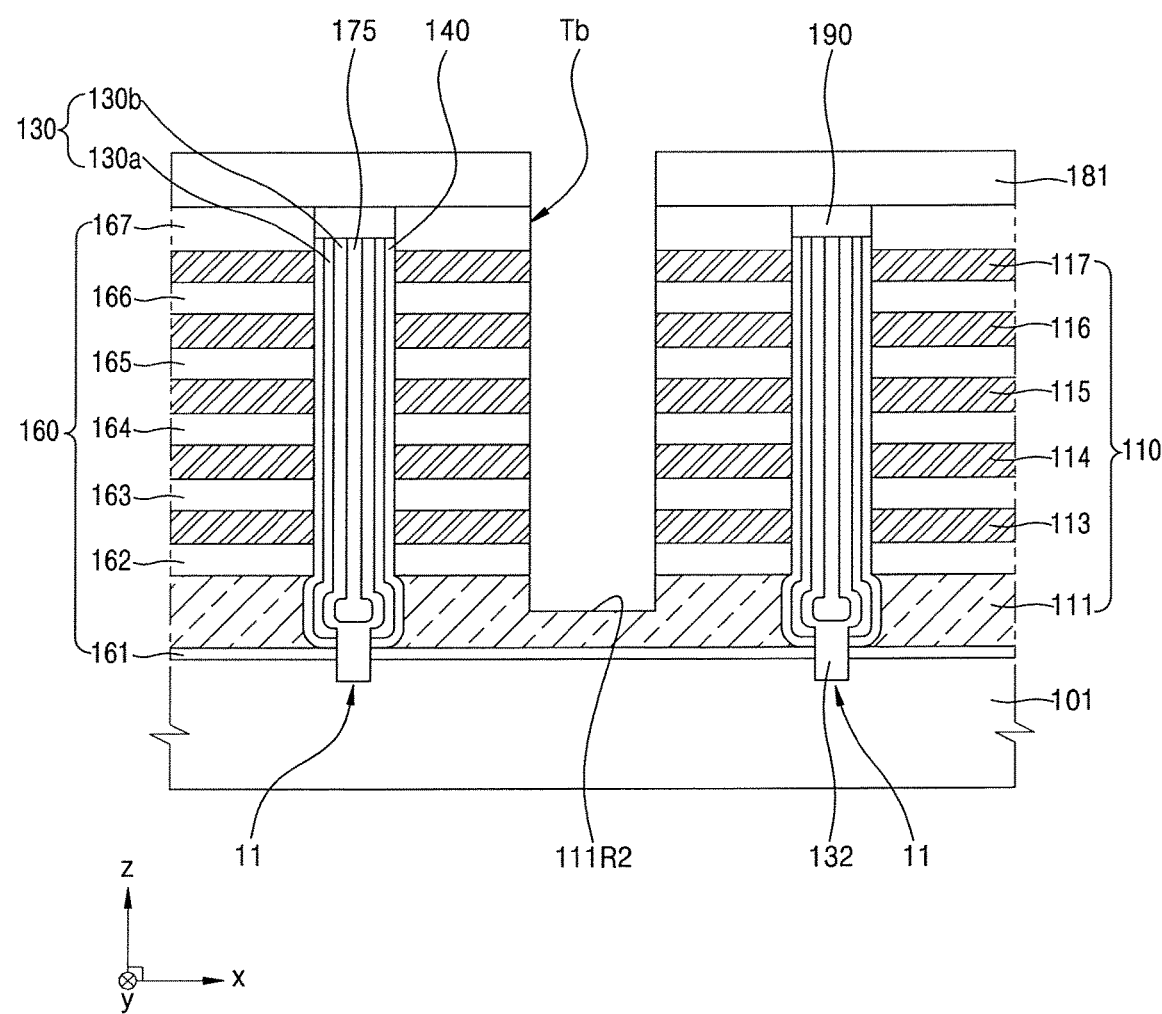
Figure 6M:
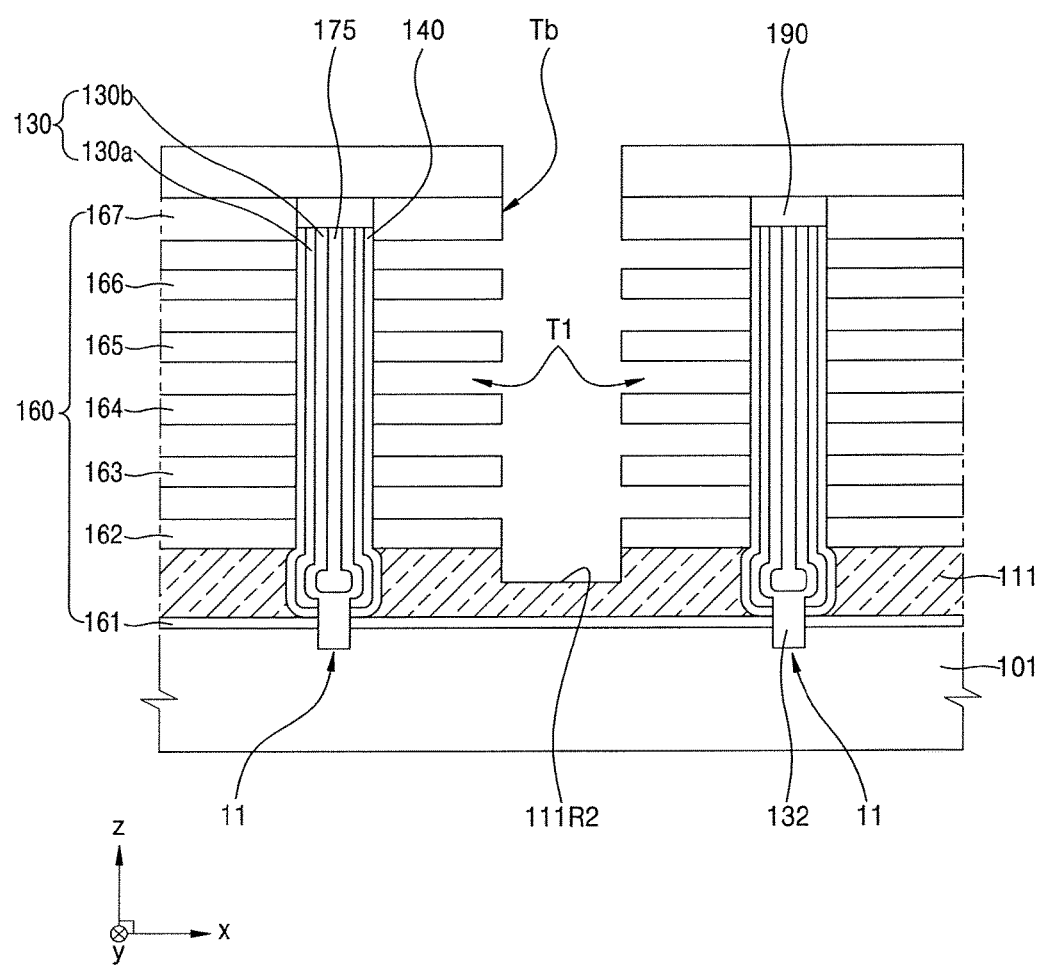
Figure 6N:
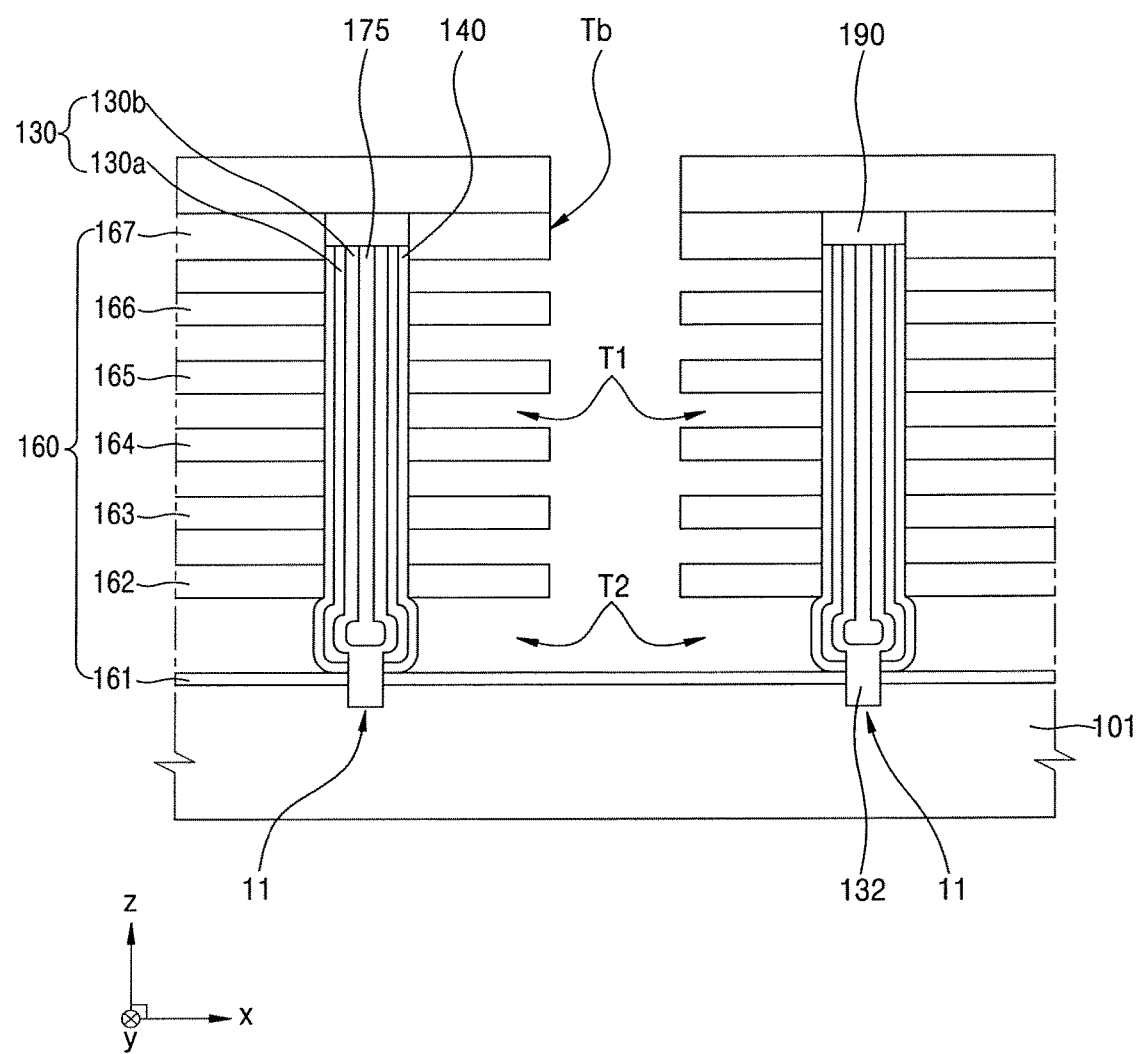
Figure 60:
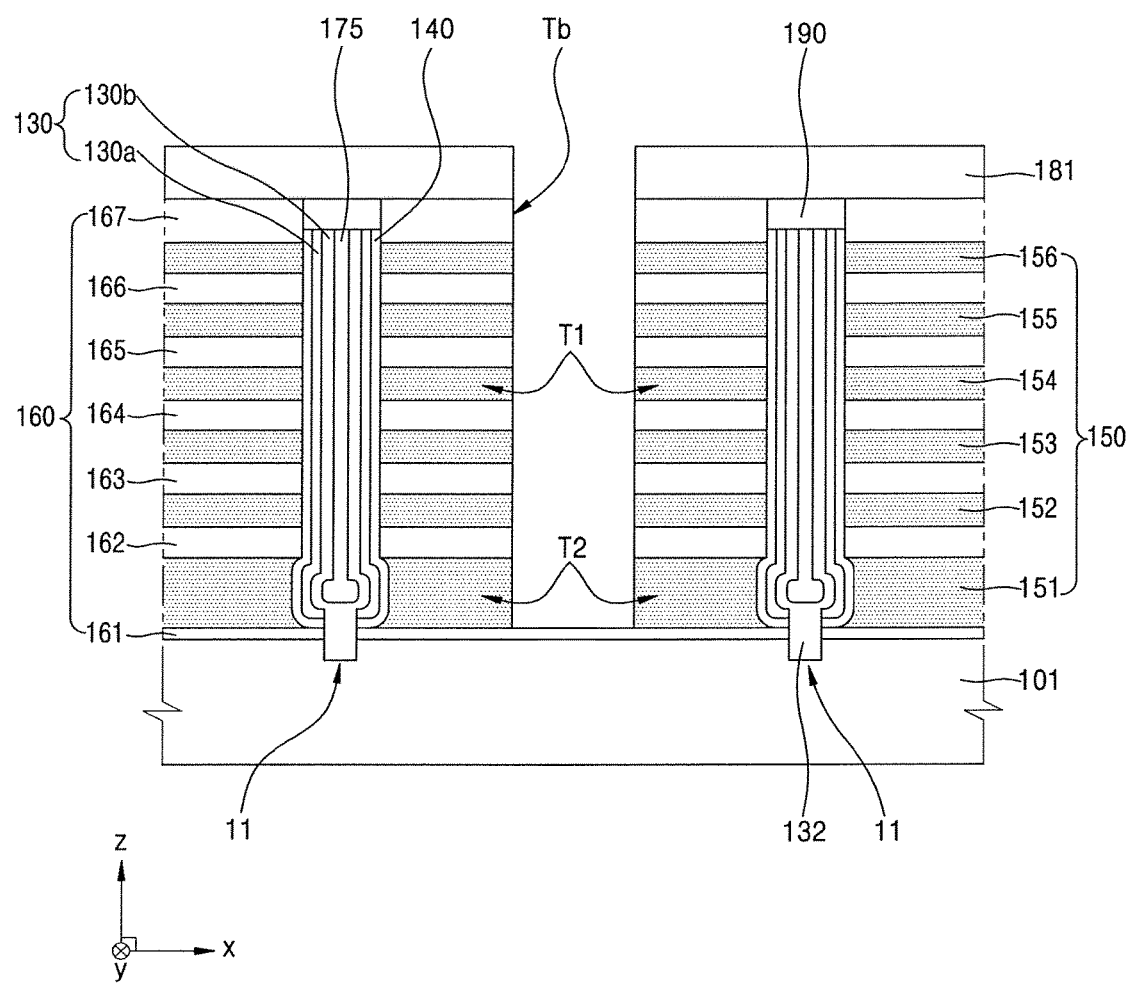
Figure 6P:
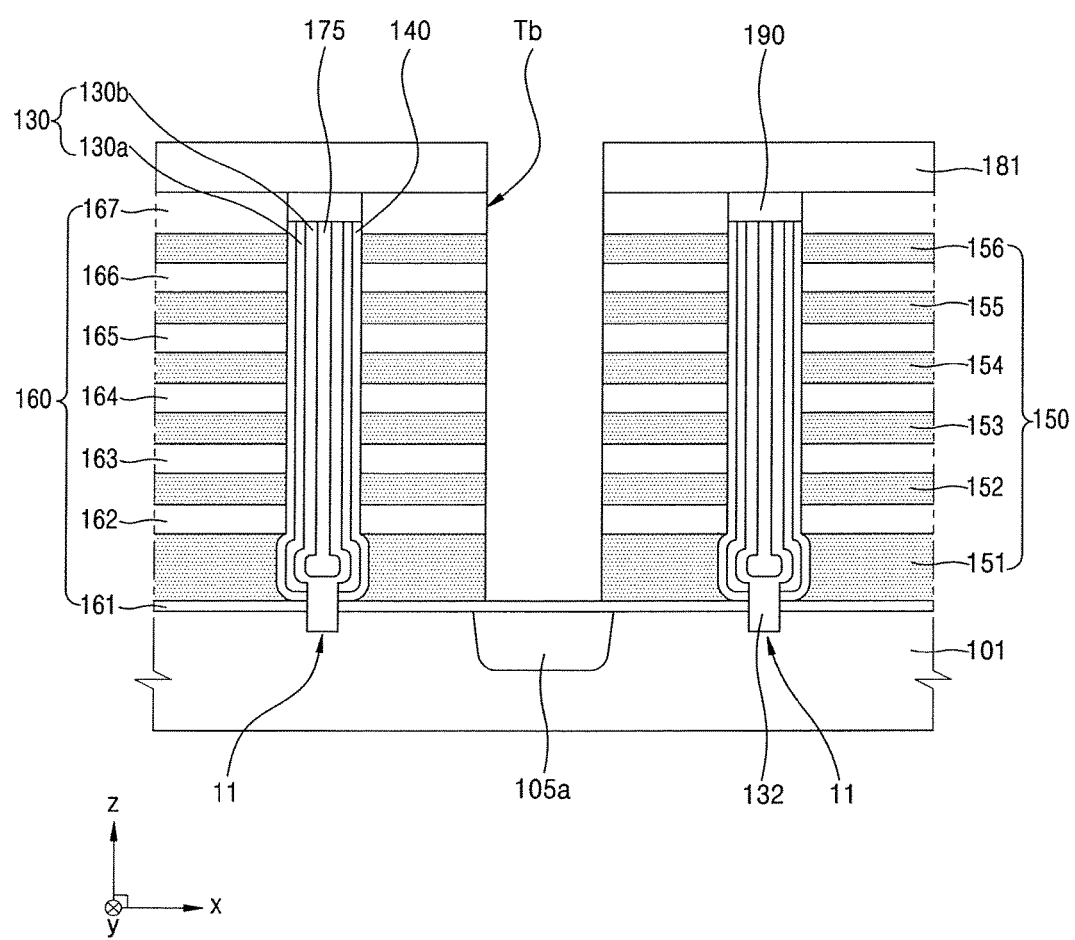
Figure 6Q:
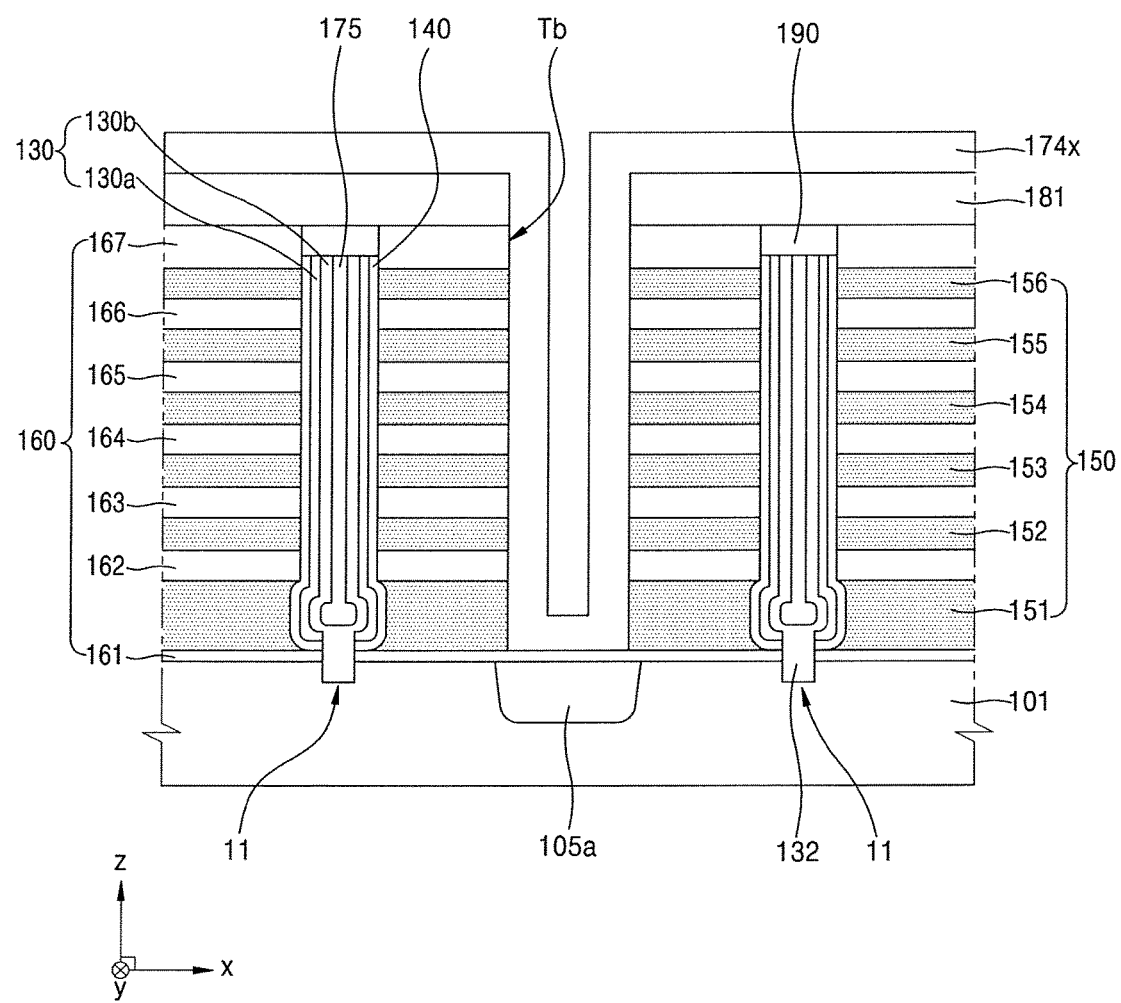
Figure 6R:
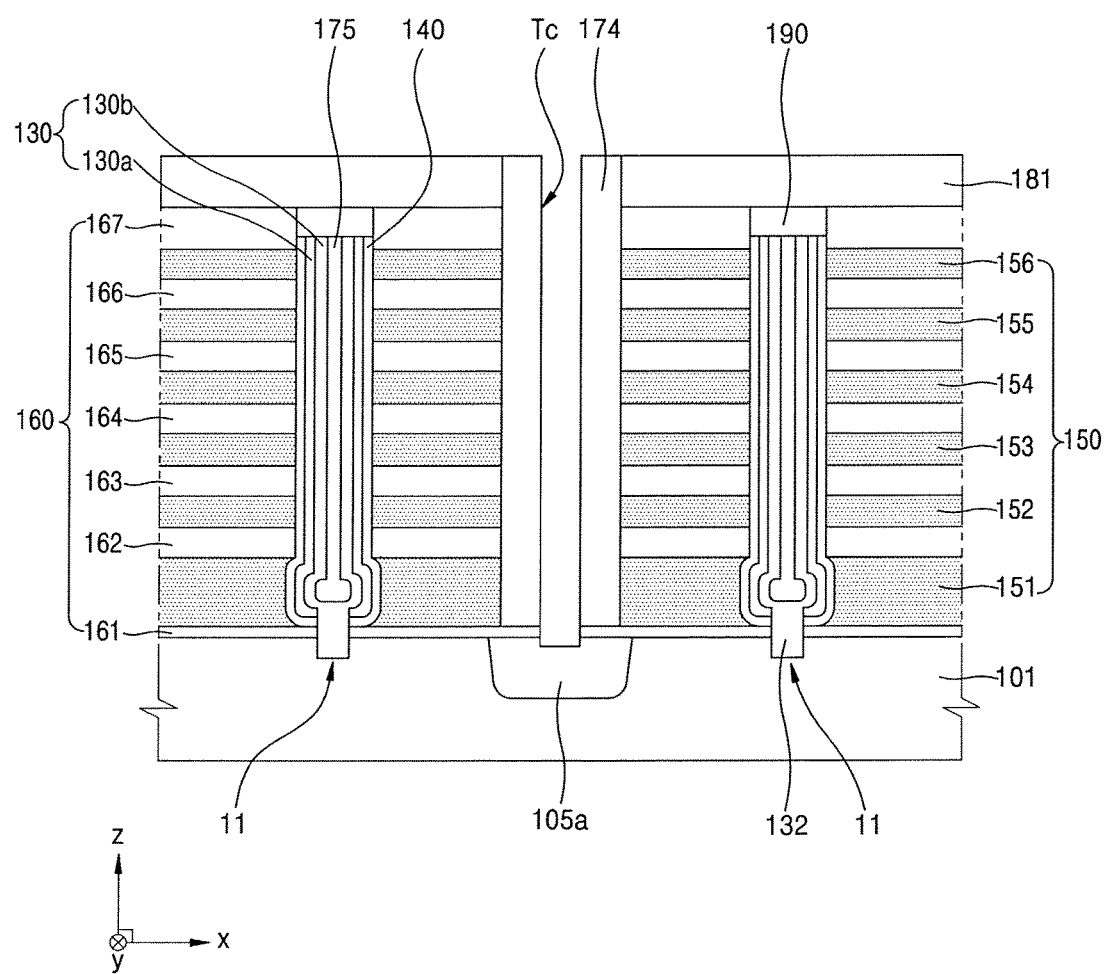
Figure 6S:
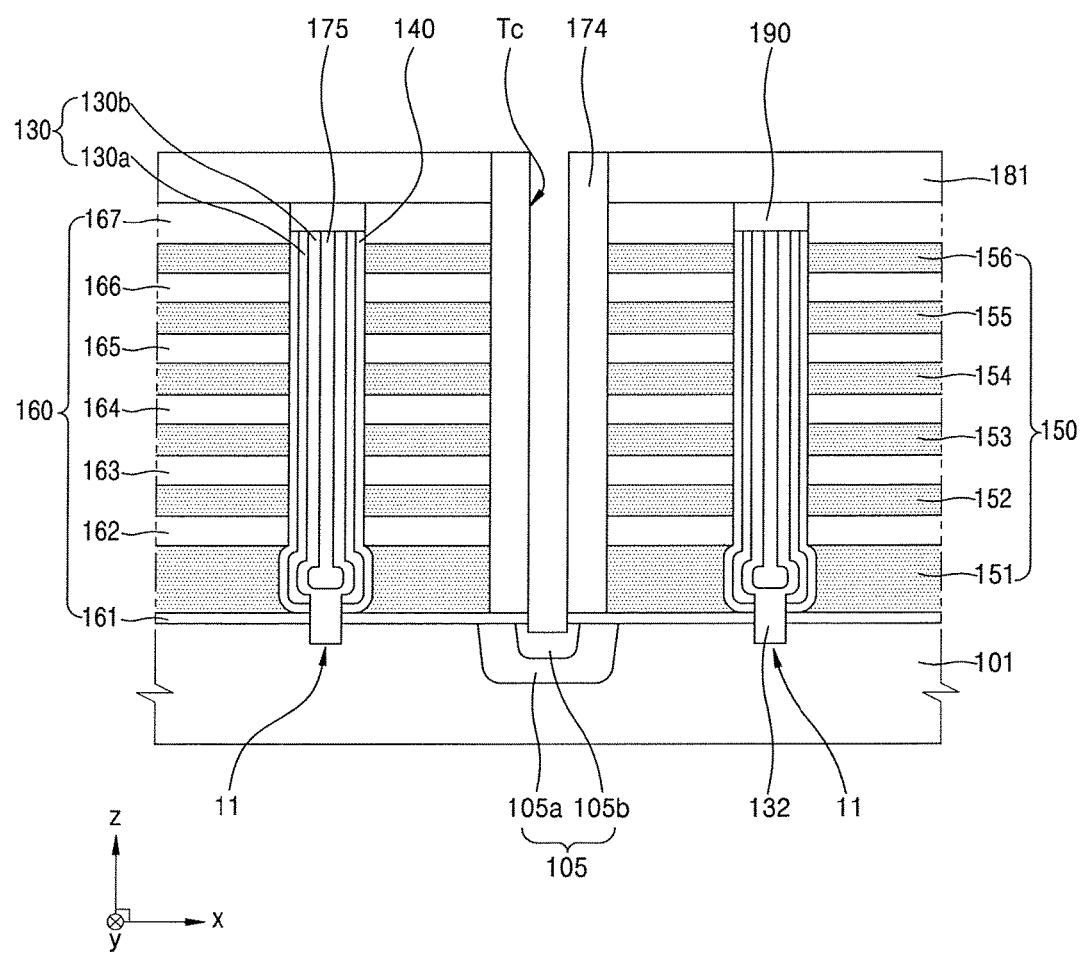
Figure 6T:
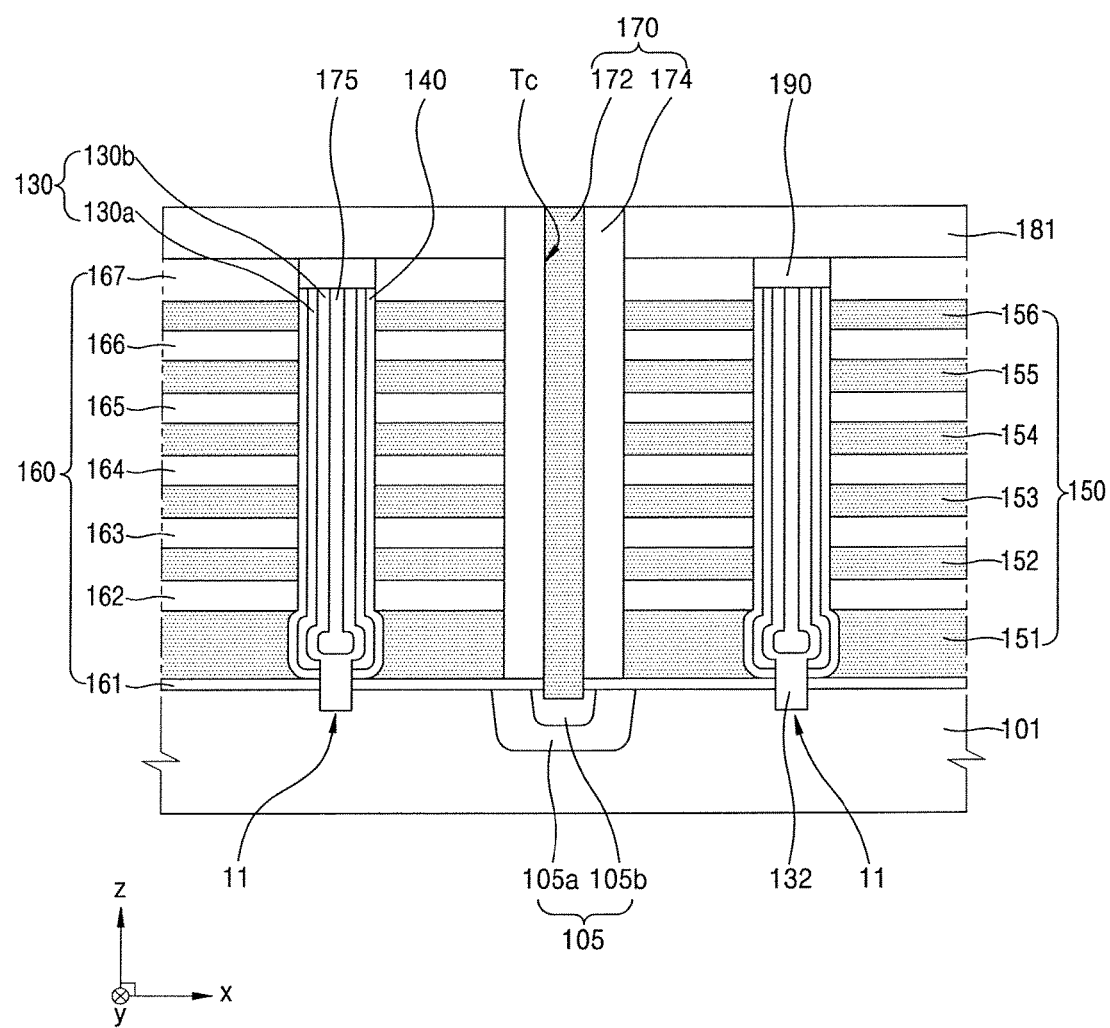
Figure 6U:
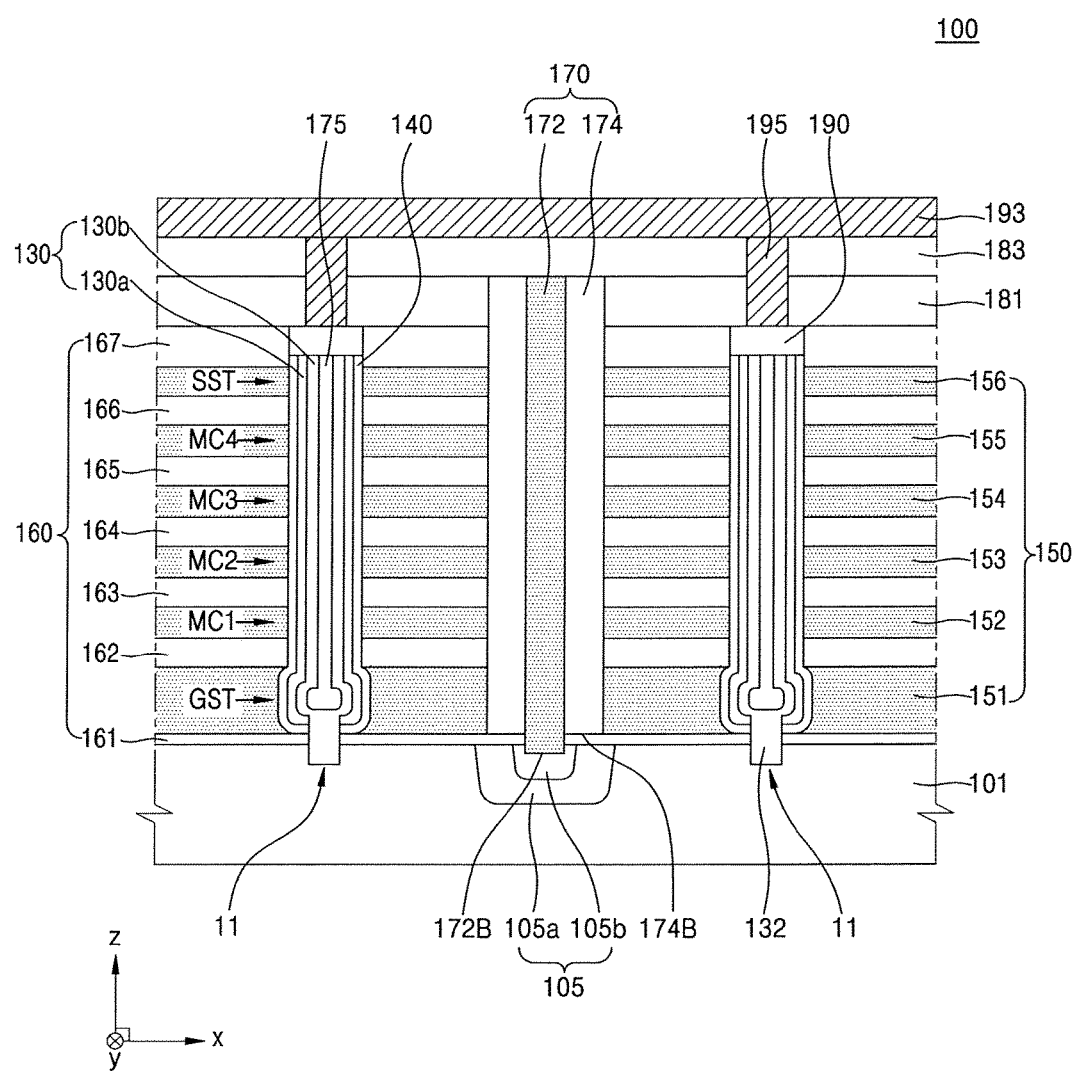

FIGS. 6A to 6U are cross-sectional views illustrated according to a process sequence in order to describe a method of manufacturing a non-volatile memory device, according to an exemplary embodiment of the inventive concept. In FIGS. 6A to 6U, elements that are the same as those in FIGS. 1 to 5B are designated by the same reference numerals, and a repeated description thereof is omitted for simplification.

Referring to FIG. 6A, the interlayer insulating layers 161 to 167 (160) and a plurality of sacrificial layers 111 and 113 to 117 (110) may be alternately stacked on the substrate 101. As illustrated in FIG. 6A, the interlayer insulating layers 160 and the sacrificial layers 110 may be alternately stacked on the substrate 101, with the first interlayer insulating layer 161 stacked first on the substrate 101.

Second sacrificial layers 113 to 117 may include a material having etch selectivity with respect to the interlayer insulating layers 160. For example, the second sacrificial layers 113 to 117 may include a material which may cause the second sacrificial layers 113 to 117 to be etched with a higher etch rate than that of the interlayer insulating layers 160 with respect to a predetermined etchant. That is, the second sacrificial layers 113 to 117 may include a material which may cause the second sacrificial layers 113 to 117 to be etched while minimizing etching of the interlayer insulating layers 160 with respect to the predetermined etchant. For example, the interlayer insulating layers 160 may include at least one of a silicon oxide layer and a silicon nitride layer; and the second sacrificial layers 113 to 117 may include one selected from a silicon layer, a silicon oxide layer, silicon carbide and a silicon nitride layer, which may be another material different from the material included in the interlayer insulating layers 160 and having etch selectivity with respect to the interlayer insulating layers 160.

A first sacrificial layer 111 may include a material having etch selectivity with respect to the interlayer insulating layers 160 and not having etch selectivity with respect to the second sacrificial layers 113 to 117 above the first sacrificial layer 111. For example, the first sacrificial layer 111 may include a material having a lower etch rate than that of the second sacrificial layers 113 to 117 with respect to a first etchant and having a higher etch rate than that of the interlayer insulating layers 160 with respect to a second etchant. For example, when the second sacrificial layers 113 to 117 are etched using the first etchant, etching of the first sacrificial layer 111 and the interlayer insulating layers 160 may be minimized, and when the first sacrificial layer 111 is etched using the second etchant, etching of the interlayer insulating layers 160 may be minimized. In an exemplary embodiment of the inventive concept, the first sacrificial layer 111 may include polysilicon.

In an exemplary embodiment of the inventive concept, not all thicknesses of the interlayer insulating layers 160 may be the same. The first interlayer insulating layer 161, which is the lowermost layer of the interlayer insulating layers 160, may be very thin. The first interlayer insulating layer 161 may include a material which is the same as that of the second interlayer insulating layers 162 to 167 above the first interlayer insulating layer 161 or may include a material which is different from that of the second interlayer insulating layers 162 to 167. Even when the first interlayer insulating layer 161 includes a material which is different from that of the second interlayer insulating layers 162 to 167, etch selectivity with respect to the sacrificial layers 110 may be the same as described above. The first interlayer insulating layer 161 may be a kind of buffer layer and may include an MTO layer.

Thicknesses of the interlayer insulating layers 160 and the sacrificial layers 110 may have various modifications of those illustrated in FIG. 6A. For example, although it is illustrated in FIG. 6A that the first sacrificial layer 111 is thicker than each of the second sacrificial layers 113 to 117, the first sacrificial layer 111 and each of the second sacrificial layers 113 to 117 may have substantially the same thickness. In addition, the number of layers included in the interlayer insulating layers 160 and the sacrificial layers 110 may be variously modified.

Referring to FIG. 6B, a first etching process of forming first middle opening portions Ta' penetrating the second interlayer insulating layers 162 to 167 and the second sacrificial layers 113 to 117 which are alternately stacked, and exposing a portion of the first sacrificial layer 111, may be performed.

The first etching process may be performed by forming a predetermined mask pattern for defining a position of the first middle opening portions Ta' on the interlayer insulating layers 160 and the sacrificial layers 110 which are alternately stacked, and using an etchant which may etch the second interlayer insulating layers 162 to 167 and the second sacrificial layers 113 to 117 together by using the mask pattern as an etching mask.

The first etching process may be an anisotropic etching process. For example, the first etching process may be any one of physical etching such as sputter etching, chemical etching such as reactive radical etching, and physicochemical etching such as reactive ion etching (RIE), magnetically enhanced RIE (MERIE), transformer coupled plasma (TCP) etching, or inductively coupled plasma (ICP) etching.

In the first etching process, the first sacrificial layer 111 may serve as an etch stopper. Accordingly, as illustrated in FIG. 6B, a top surface of the first sacrificial layer 111 may be exposed.

In an exemplary embodiment of the inventive concept, an upper region of the first sacrificial layer 111 may be removed during the first etching process, and thus, the first sacrificial layer 111 after the first etching process being performed may have a recess 111R1.

Referring to FIG. 6C, a second etching process of forming a first opening portion Ta by etching the first sacrificial layer 111 exposed via a first middle opening portion Ta' may be performed.

First opening portions Ta may have a plan view structure having a shape of holes extending in the z direction. However, a structure of the first opening portions Ta is not limited to the holes. That is, the first opening portions Ta may have one or more forms according to the structure of a channel region to be formed. Also, the first opening portions Ta may be isolated regions spaced apart from each other in the x and y directions in a plan view.

The second etching process may be an isotropic etching process in which an etchant different from the etchant used to etch upper layers 113 to 117 and 162 to 167 is used. For example, the second etching process may be performed by using an etchant having a low etch rate with respect to the upper layers 113 to 117 and 162 to 167 and the first interlayer insulating layer 161 and having a high etch rate with respect to the first sacrificial layer 111.

Through the second etching process, a top surface of the first interlayer insulating layer 161 may be exposed via the first opening portion Ta. In an exemplary embodiment of the inventive concept, an upper portion of the first interlayer insulating layer 161 may be removed by the second etching process.

As the second etching process is performed with isotropic etching, the first opening portion Ta may have a bulb-type cross-section structure, as illustrated in FIG. 6C. That is, a width Ta_W1 of the first opening portion Ta measured in the x direction in a portion (region A 1 of FIG. 6C) that is adjacent to the first sacrificial layer 111 may be greater than a width Ta_W2 of the first opening portion Ta measured in the x direction in a portion (region A2 of FIG. 6C) that is adjacent to the second sacrificial layers 113 to 117 and the second interlayer insulating layers 162 to 167.

In an exemplary embodiment of the inventive concept, the second etching process may be, but is not limited thereto, a wet etch process, a chemical dry etch (CDE) process, a dry gas phase etch (GPE) process, or the like. As such, during the second etching process, the first interlayer insulating layer 161 may remain and thus prevent the substrate 101 from being exposed by the first opening portion Ta, thereby lowering distribution of the first opening portions Ta. Further, as the second etching process is performed with isotropic etching, the first opening portion Ta may have a bulb-type cross-section structure, and accordingly, a good etching process margin in an etching process (refer to FIG. 6G) for forming the contact portion 132 of the channel region 130, which is a subsequent process, may be sufficiently obtained.

Referring to FIG. 6D, the gate dielectric layer 140 uniformly covering interior walls and a bottom surface of each of the first opening portions Ta may be formed. As described above with reference to FIG. 3, the gate dielectric layer 140 may include the blocking insulating layer 146 (refer to FIG. 3), the charge storage layer 144 (refer to FIG. 3), and the tunneling insulating layer 142 (refer to FIG. 3). Accordingly, the blocking insulating layer 146, the charge storage layer 144, and the tunneling insulating layer 142 may be stacked in the first opening portions Ta in this stated order.

As described above, each of the first opening portions Ta exposes the top surface of the first interlayer insulating layer 161, and accordingly, a bottom surface of the gate dielectric layer 140 may contact the top surface of the first interlayer insulating layer 161.

In an exemplary embodiment of the inventive concept, each of the blocking insulating layer 146, the charge storage layer 144, and the tunneling insulating layer 142 may be formed by using, for example, a CVD process, a physical vapor deposition (PVD) process, a metal organic CVD (MOCVD) process, an atomic layer deposition (ALD) process, a metal organic ALD (MOALD) process, or the like, but is not limited thereto.

Referring to FIG. 6E, the first channel layer 130a may be formed on the gate dielectric layer 140. The first channel layer 130a may include a semiconductor material such as polysilicon or single crystalline silicon. The semiconductor material may not be doped or may include p-type or n-type impurities. In an exemplary embodiment of the inventive concept, the first channel layer 130a may be formed by using a process such as an ALD process or a CVD process.

Referring to FIG. 6F, a spacer layer 135 may be formed on the first channel layer 130a. In an exemplary embodiment of the inventive concept, the spacer layer 135 may include, for example, a silicon oxide layer or a silicon nitride layer and may be formed by using ALD or CVD. The spacer layer 135 may be used as a mask for etching bottom surfaces of the first channel layer 130a and the gate dielectric layer 140, and may prevent the first channel layer 130a from being damaged in the etching process.

The spacer layer 135 in the present exemplary embodiment of the inventive concept covers the entire region of the first channel layer 130a, but is not limited thereto. For example, the spacer layer 135 may cover only side walls of the first channel layer 130a, which is different from that illustrated in FIG. 6F.

Referring to FIG. 6G, the spacer layer 135 may be used as an etching mask to perform anisotropic etching on both bottom surfaces of the first channel layer 130a and the gate dielectric layer 140, and on the first interlayer insulating layer 161. A contact hole 101 H exposing the substrate 101 may be formed by the anisotropic etching process. As illustrated in FIG. 6G, in the anisotropic etching process, the substrate 101 may be overly etched and recessed to have a predetermined depth. As the substrate 101 is recessed as such, a contact region of the second channel layer 130b (refer to FIG. 2B), which is to be filled in the recess by a subsequent process, and the substrate 101 may be larger, and thus, channel resistance may be smaller.

Referring to FIG. 6H, the spacer layer 135 remaining on side walls of the first channel layer 130a may be removed. The spacer layer 135 may be removed, for example, through a wet cleaning process, or the like. The wet cleaning process may be performed by using, for example, a mixed solution of ammonia, peroxide and fluoride. Removing the spacer layer 135 may be performed by a separate process or by a cleaning process performed before forming the second channel layer 130b, which will be described below.

Referring to FIG. 6I, the second channel layer 130b may be formed on the first channel layer 130a exposed after the removal of the spacer layer 135. The first and second channel layers 130a and 130b may be defined as the channel region 130. The second channel layer 130b may fill the contact hole 101H, and accordingly, the channel region 130 may include the contact portion 132. The channel region 130 may be electrically connected to the substrate 101 via the contact portion 132. The second channel layer 130b may include a material which is the same as that of the first channel layer 130a, and may include, for example, a semiconductor material such as polysilicon or single crystalline silicon.

Referring to FIG. 6J, the first opening portion Ta, which remains after the channel region 130 is formed, may be filled with the filling insulating layer 175. Optionally, before the filling insulating layer 175 is formed, a hydrogen annealing operation in which the structure including the channel region 130 is heat-treated in a gas atmosphere including hydrogen or deuterium may be further performed. By performing the hydrogen annealing operation, many portions of crystal defects that exist in the channel region 130 may be repaired.

To remove unnecessary semiconductor materials and insulating materials which cover the uppermost second interlayer insulating layer 167, a planarization process, for example, chemical mechanical polishing (CMP) or an etch-back process, may be performed until a top surface of the second interlayer insulating layer 167 is exposed.

When the etch-back process is performed, as illustrated in FIG. 6J, upper portions of the channel region 130, the gate dielectric layer 140, and the filling insulating layer 175 may be removed, and thus, a top surface of each of the channel region 130, the gate dielectric layer 140, and the filling insulating layer 175 may be located at a lower level than the top surface of the second interlayer insulating layer 167. Thereafter, the conductive layer 190 covering the top surface of each of the channel region 130, the gate dielectric layer 140, and the filling insulating layer 175 may be formed. The conductive layer 190 may act as a drain region of the string selection transistor SST (refer to FIG. 2B). In an exemplary embodiment of the inventive concept, the conductive layer 190 may include polysilicon doped with n-type impurities, such as phosphorus (P), arsenic (As), or antimony (Sb).

As the filling insulating layer 175 and the conductive layer 190 are formed as described above, the memory cell strings 11 may be completed.

Referring to FIG. 6K, after the conductive layer 190 is formed, the upper insulating layer 181 covering top surfaces of the conductive layer 190 and the second interlayer insulating layer 167 may be formed. The upper insulating layer 181 may protect the conductive layer 190 from damage, contamination, or the like, which may be caused by subsequent processes for forming the common source line structure 170.

Referring to FIG. 6L, anisotropic etching may be performed on the upper insulating layer 181, the interlayer insulating layers 160, and the second sacrificial layers 113 to 117 between the memory cell strings 11 to form a second opening portion Tb exposing the first sacrificial layer 111. As in the first etching process described with reference to FIG. 6B, the first sacrificial layer 111 may serve as an etch stopper when the second opening portion Tb is formed.

In an exemplary embodiment of the inventive concept, an upper region of the first sacrificial layer 111 may be removed during a process of forming the second opening portion Tb, and thus, the first sacrificial layer 111 may have a recess 111R2.

The second opening portion Tb may extend in the y direction. Although only one second opening portion Tb is illustrated in FIG. 6L, second opening portions Tb may respectively be formed between the memory cell strings 11 that are disposed adjacent to each other in the x direction.

Referring to FIG. 6M, the second sacrificial layers 113 to 117 (refer to FIG. 6L) exposed via the second opening portion Tb may be removed to form a plurality of first lateral opening portions T1 defined between the interlayer insulating layers 160. A process of removing the second sacrificial layers 113 to 117 may be performed, for example, through a pullback etching process.

Side surfaces of the gate dielectric layer 140 may be partially exposed via the first lateral opening portions T1.

The first lateral opening portions T1 may be formed by horizontally etching the second sacrificial layers 113 to 117 with an etchant having etch selectivity with respect to the interlayer insulating layers 160 and the first sacrificial layer 111. For example, when the second sacrificial layers 113 to 117 are silicon nitride layers, the first sacrificial layer 111 is a polysilicon layer, and the interlayer insulating layers 160 are silicon oxide layers, the etching process may be performed using an etchant including phosphoric acid. The etching process may be, for example, a wet etching process, a CDE process, a dry GPE process, or the like. Such an etching process may be an isotropic etching process.

Referring to FIG. 6N, the first sacrificial layer 111 (refer to FIG. 6M) exposed via the second opening portion Tb may be removed to form second lateral opening portions T2 defined between the first interlayer insulating layer 161 and the second interlayer insulating layer 162. A process of removing the first sacrificial layer 111 may be performed, for example, through a pullback etching process.

The second lateral opening portions T2 may be formed by horizontally etching the first sacrificial layer 111 with an etchant having etch selectivity with respect to the interlayer insulating layers 160. For example, when the first sacrificial layer 111 is a polysilicon layer, and the interlayer insulating layers 160 are silicon oxide layers, the etching process may be performed by using an etchant including halogen-containing reaction gas. The etching process may be, for example, a wet etching process, a CDE process, a dry GPE process, or the like. Such an etching process may be an isotropic etching process.

Although, in the present exemplary embodiment of the inventive concept, the first sacrificial layer 111 and the second sacrificial layers 113 to 117 are removed by separate etching processes, the first sacrificial layer 111 and the second sacrificial layers 113 to 117 may be removed simultaneously by a single etching process.

Even after the first sacrificial layer 111 and the second sacrificial layers 113 to 117 are removed, the substrate 101 may not be exposed by the lateral opening portions T1 and T2 as the first interlayer insulating layer 161 covers the top surface of the substrate 101. As the substrate 101 is not exposed to a pullback etching process for removing the first sacrificial layer 111 and the second sacrificial layers 113 to 117, the substrate 101 may be prevented from being damaged during the pullback etching process.

Referring to FIG. 6O, the second opening portion Tb and the lateral opening portions T1 and T2 may be filled with a conductive material. The conductive material may be metal, for example, tungsten. After the conductive material is filled therein, the conductive material may be removed from the second opening portion Tb so that the conductive material remains only in the lateral opening portions T1 and T2. Accordingly, respective gate electrodes 151 to 156 (150) of the ground selection transistor GST, the memory cell transistors MC1, MC2, MC3, and MC4, and the string selection transistor SST may be formed, wherein the respective gate electrodes 151 to 156 (150) including the conductive material remain in the lateral opening portions T1 and T2.

As all of the gate electrodes 150 include a metallic layer such as tungsten, resistance of the gate electrodes 150 may be remarkably smaller compared to when the gate electrodes 150 include polysilicon. Particularly, as the gate electrode 151 of the ground selection transistor GST includes a metallic layer, operating characteristics of the ground selection transistor GST may be improved.

In an exemplary embodiment of the inventive concept, a process of removing the conductive material in the second opening portion Tb may be an anisotropic etching process or an isotropic etching process. For example, the process of removing the conductive material in the second opening portion Tb may be a wet etching process in which an etchant having a relatively high selective etch ratio with respect to the conductive material and a relatively low selective etch ratio with respect to the interlayer insulating layers 160 is used. In this case, as the conductive material in the second opening portion Tb is preferentially exposed to the etchant, only the conductive material in the second opening portion Tb may be removed with the conductive material in the lateral opening portions T1 and T2 remained by adjusting time of the wet etching process or the like. However, unlike that illustrated in FIG. 6O, in addition to the removal of the conductive material from the second opening portion Tb during the wet etching process, a portion of the conductive material in the lateral opening portions T1 and T2 that is adjacent to the second opening portion Tb may also be removed.

Referring to FIG. 6P, impurities may be injected into the substrate 101 via the second opening portion Tb to form the first impurity region 105a. In an exemplary embodiment of the inventive concept, the first impurity region 105a may be a low-concentration impurity region.

Referring to FIG. 6Q, an insulating layer 174x may be formed on interior walls of the second opening portion Tb and a top surface of the upper insulating layer 181. The insulating layer 174x may be formed by using, for example, silicon oxide, silicon nitride, silicon oxynitride, or the like.

Referring to FIG. 6R, an anisotropic etching process may be performed on the insulating layer 174x (refer to FIG. 6Q) to form the common source line spacer 174. The first interlayer insulating layer 161 located in a third opening portion Tc defined by side walls of the common source line spacer 174 may be removed by the etching process, and thus, the first impurity region 105a in the substrate 101 may be exposed.

Referring to FIG. 6S, impurities may be injected into the substrate 101 via the third opening portion Tc to form the second impurity region 105b. In an exemplary embodiment of the inventive concept, the second impurity region 105b may be a high-concentration impurity region. The impurity region 105 including the first impurity region 105a and the second impurity region 105b may serve as a source region.

Referring to FIG. 6T, a conductive layer, such as tungsten, tantalum, cobalt, tungsten silicide, tantalum silicide, cobalt silicide, etc., may be filled in the third opening portion Tc, and then, a planarization process may be performed on the conductive layer until the top surface of the upper insulating layer 181 is exposed to form the common source line 172. The common source line 172 may be connected to the impurity region 105 of the substrate 101. The common source line 172 and the common source line spacer 174 may constitute the common source line structure 170.

Referring to FIG. 6U, the common source line buried insulating layer 183 covering the common source line structure 170 and the upper insulating layer 181 may be formed, and then, the bitline contact plug 195 penetrating the common source line buried insulating layer 183 and the upper insulating layer 181 and contacting the conductive layer 190 may be formed through a photolithography process and an etching process. Thereafter, the bitline 193 extending in the x direction on the common source line buried insulating layer 183 and connected to bitline contact plugs 195 may be formed.

FIGS. 7A to 7D are cross-sectional views illustrated according to a process sequence in order to describe a method of manufacturing a non-volatile memory device, according to an exemplary embodiment of the inventive concept. In FIGS. 7A to 7D, elements that are the same as those in FIGS. 1 to 6U are designated by the same reference numerals, and a repeated description thereof is omitted for simplification.

Figure 7A:
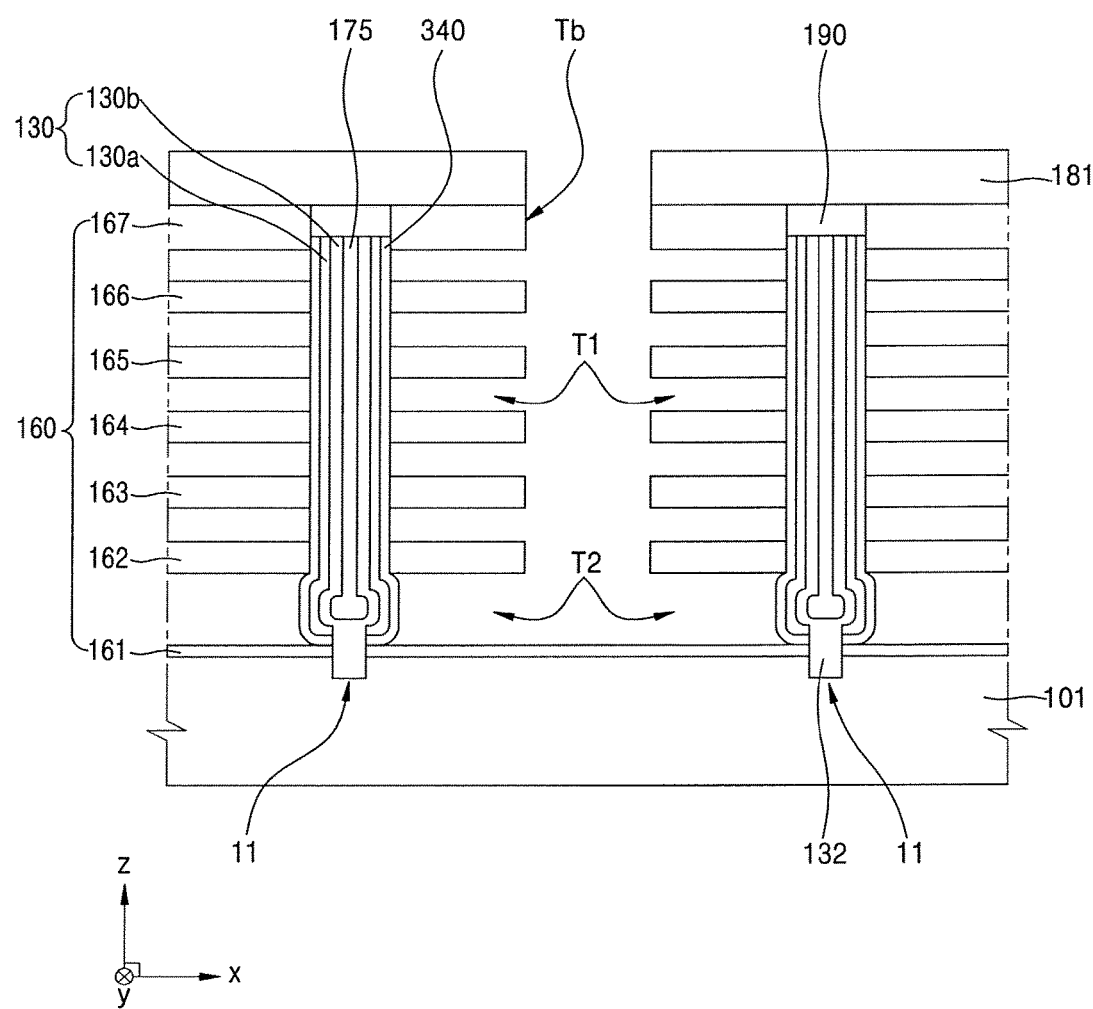
FIGS. 7A to 7D are cross-sectional views illustrated according to a process sequence in order to describe a method of manufacturing a non-volatile memory device, according to an exemplary embodiment of the inventive concept.

Referring to FIG. 7A, a structure including the first lateral opening portions T1 and the second lateral opening portions T2 defined between the interlayer insulating layers 160 may be prepared by processes substantially the same as or similar to those described with reference to FIGS. 6A to 6N.

The gate dielectric layer 340 may have a structure including the tunneling insulating layer 342, the charge storage layer 344, and the first blocking insulating layer 346, which are sequentially stacked on a side wall of the first channel layer 130a in this stated order, as described above with reference to FIG. 5B.

Figure 7B:
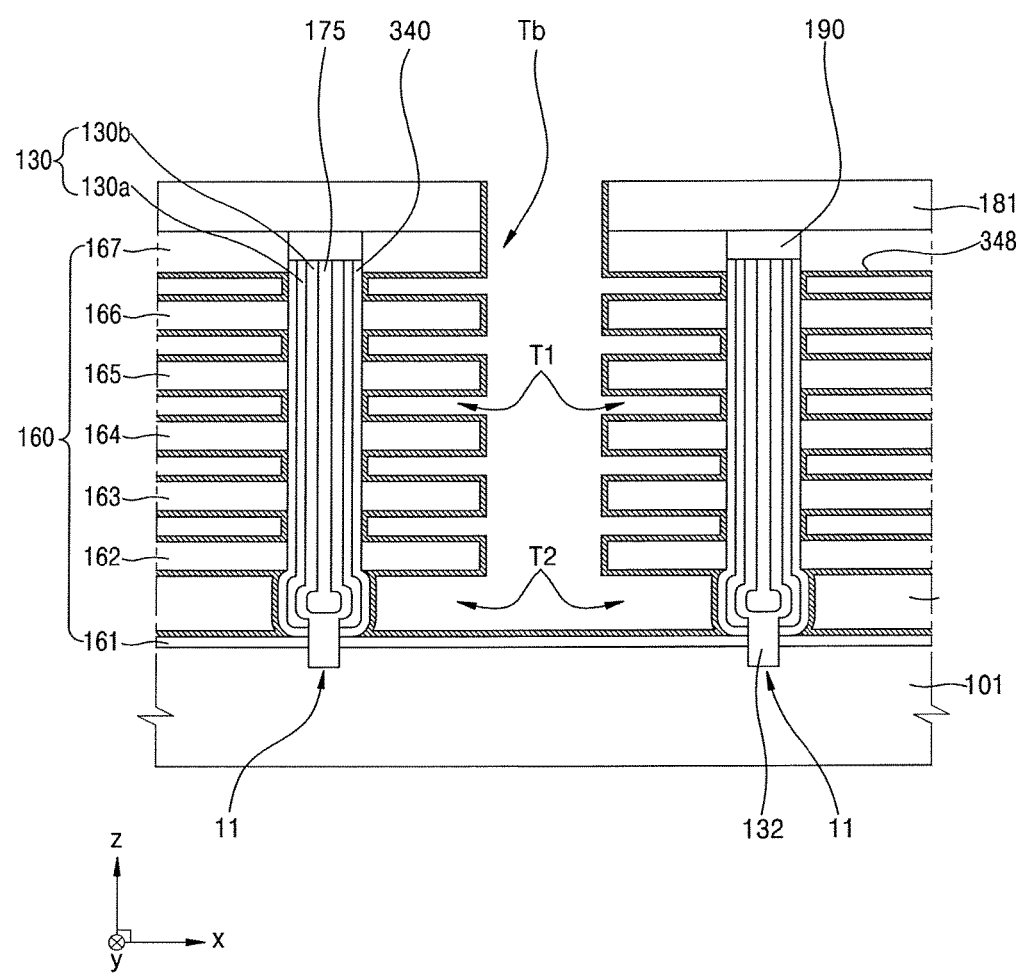

Referring to FIG. 7B, the second blocking insulating layer 348 conformally covering the second opening portion Tb, the first lateral opening portions T1, and the second lateral opening portions T2 may be formed. Accordingly, the second blocking insulating layer 348 comes into contact with a side wall of the gate dielectric layer 340, particularly, the first blocking insulating layer 346 (refer to FIG. 5B), that is exposed by the first lateral opening portions T1 and the second lateral opening portions T2.

In the case where the second blocking insulating layer 348 contacting the side wall of the first blocking insulating layer 346 is additionally formed as such, although a portion of the first blocking insulating layer 346 is damaged in a pullback etching process for forming the lateral opening portions T1 and T2 described with reference to FIG. 7A, the damaged portion may be repaired by the second blocking insulating layer 348.

The second blocking insulating layer 348 may include one or more selected from silicon oxide, silicon nitride, silicon oxynitride, and a high-k dielectric material. The high-k dielectric material may refer to a dielectric material having a higher dielectric constant than that of an oxide layer.

In an exemplary embodiment of the inventive concept, the second blocking insulating layer 348 may include, for example, at least one of aluminum oxide, tantalum oxide, titanium oxide, yttrium oxide, zirconium oxide, zirconium silicon oxide, hafnium oxide, hafnium silicon oxide, lanthanum oxide, lanthanum aluminum oxide, lanthanum hafnium oxide, hafnium aluminum oxide, and praseodymium oxide.

The second blocking insulating layer 348 may include a material which is the same as that of the first blocking insulating layer 346, but is not limited thereto.

Figure 7C:
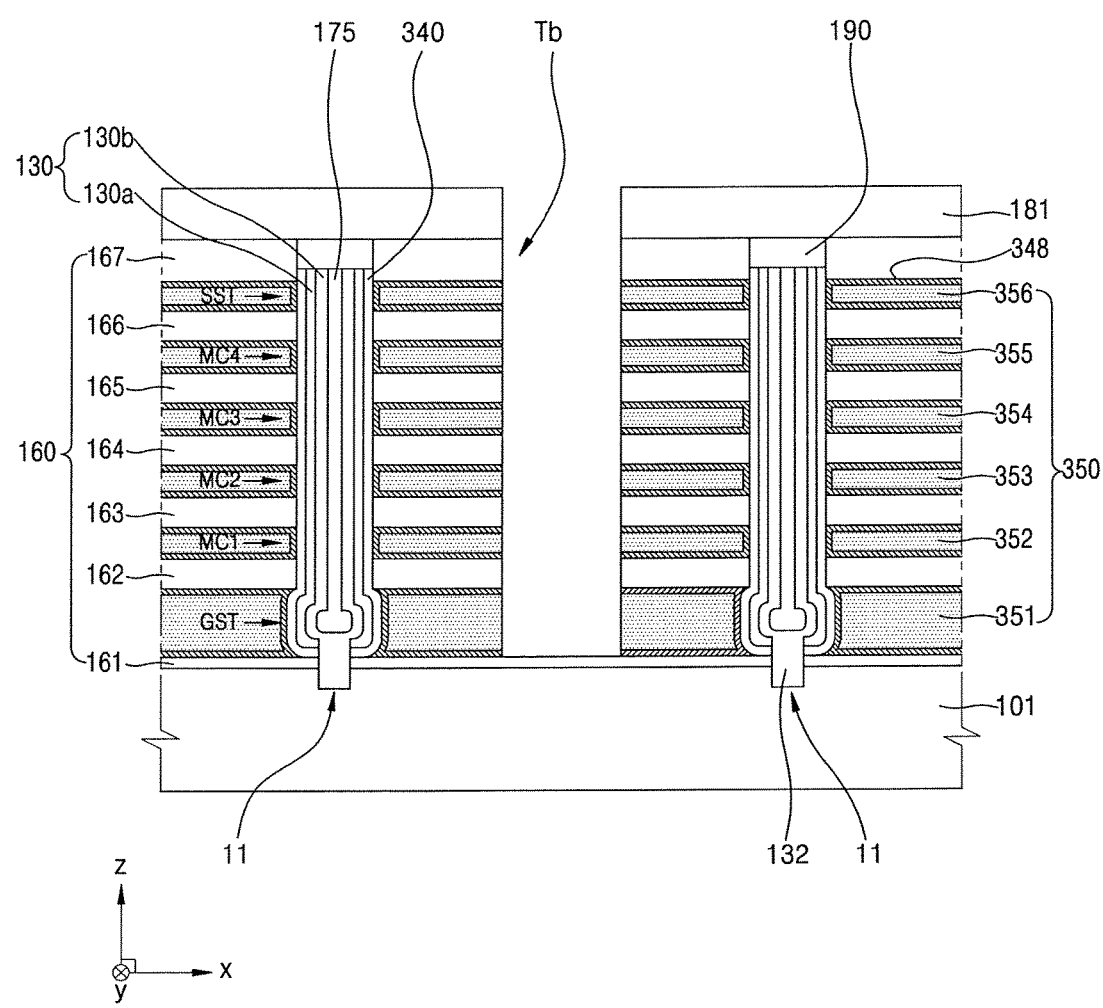

Referring to FIG. 7C, in the lateral opening portions T1 and T2 after the second blocking insulating layer 348 is formed, the gate electrodes 351 to 356 (350) may be formed. For example, first, the lateral opening portions T1 and T2 after the second blocking insulating layer 348 is formed may be filled with a conductive material. The conductive material may be metal, for example, tungsten. After the conductive material is filled therein, the conductive material in the second opening portion Tb may be removed so that only the conductive material in the lateral opening portions T1 and T2 may remain, and thus, the gate electrodes 350 may be formed. In this regard, the second blocking insulating layer 348 in the second opening portion Tb may also be removed.

In an exemplary embodiment of the inventive concept, a process of removing the conductive material and the second blocking insulating layer 348 in the second opening portion Tb may be an anisotropic etching process or an isotropic etching process. For example, the process of removing the conductive material and the second blocking insulating layer 348 in the second opening portion Tb may be a wet etching process in which an etchant having a relatively high selective etch ratio with respect to the conductive material and the second blocking insulating layer 348 and having a relatively low selective etch ratio with respect to the interlayer insulating layers 160 is used. In this case, as the conductive material and the second blocking insulating layer 348 in the second opening portion Tb are preferentially exposed to the etchant, only the conductive material and the second blocking insulating layer 348 in the second opening portion Tb may be removed with the conductive material and the second blocking insulating layer 348 in the lateral opening portions T1 and T2 remained by adjusting time of the wet etching process or the like. However, unlike that illustrated in FIG. 7C, in addition to the removal of the conductive material and the second blocking insulating layer 348 from the second opening portion Tb during the wet etching process, portions of the conductive material and the second blocking insulating layer 348 in the lateral opening portions T1 and T2 that are adjacent to the second opening portion Tb may also be removed.

Figure 7D:
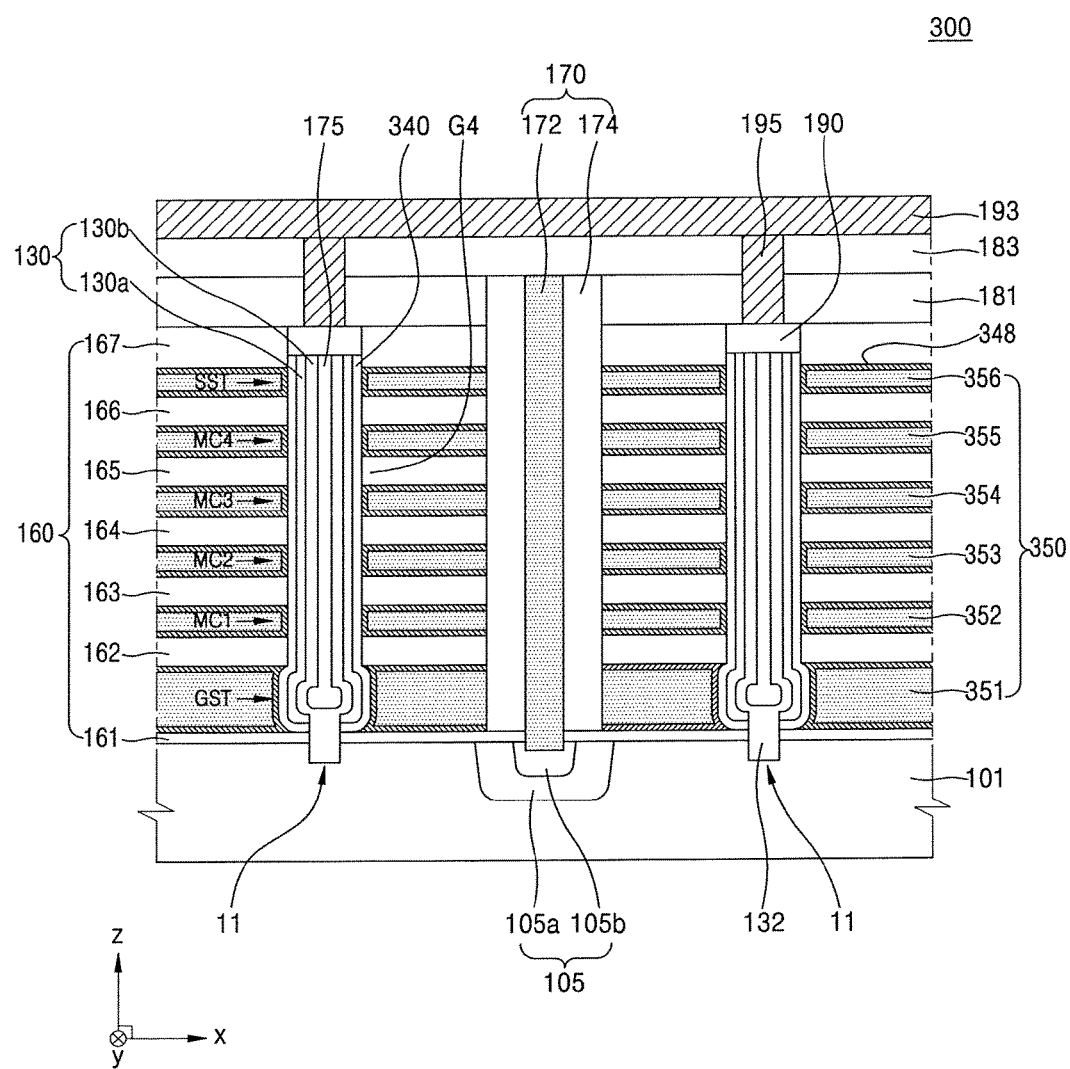

Referring to FIG. 7D, the impurity region 105 may be formed in the substrate 101, and the upper insulating layer 181, the common source line structure 170, the common source line buried insulating layer 183, the bitline contact plug 195, and the bitline 193 may be formed to complete manufacturing of the non-volatile memory device 300.

Figure 8A:
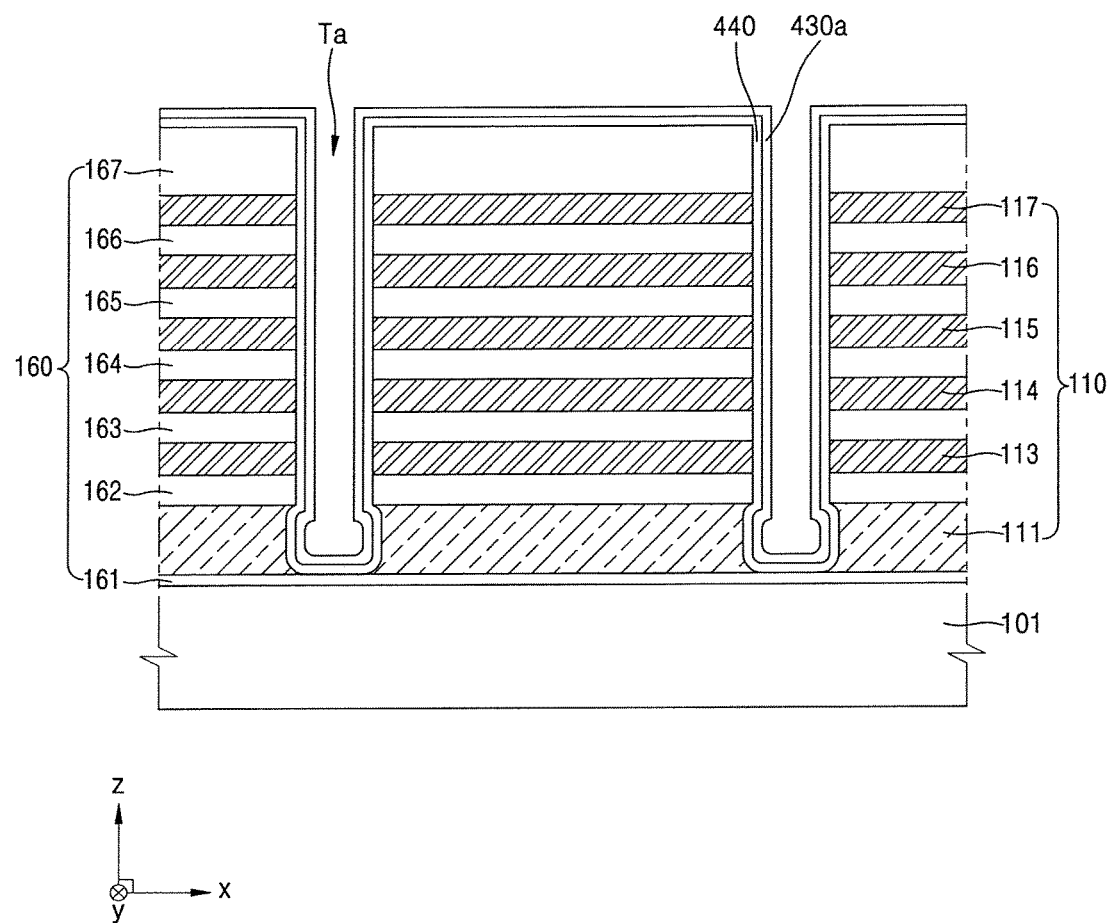
FIGS. 8A to 8C are cross-sectional views illustrated according to a process sequence in order to describe a method of manufacturing a non-volatile memory device, according to an exemplary embodiment of the inventive concept.
Figure 8B:
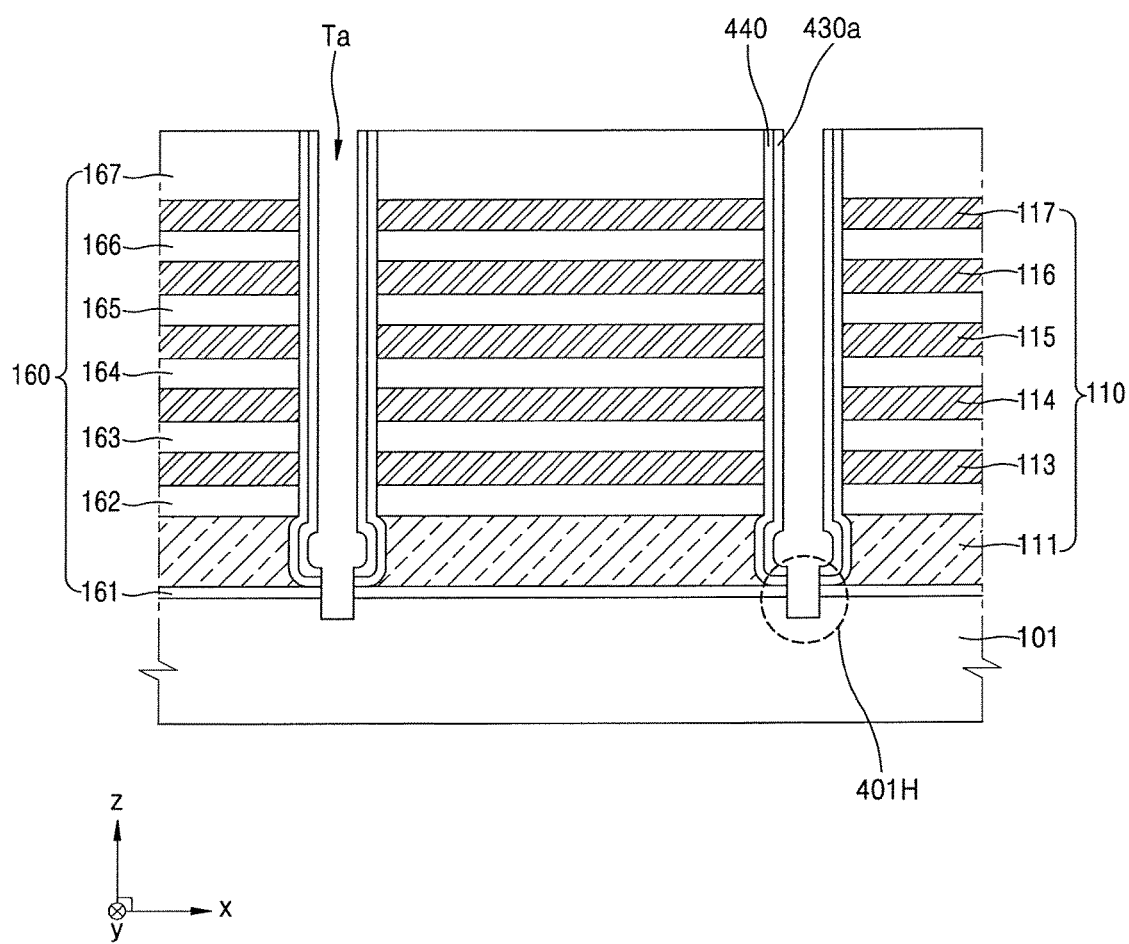
Figure 8C:
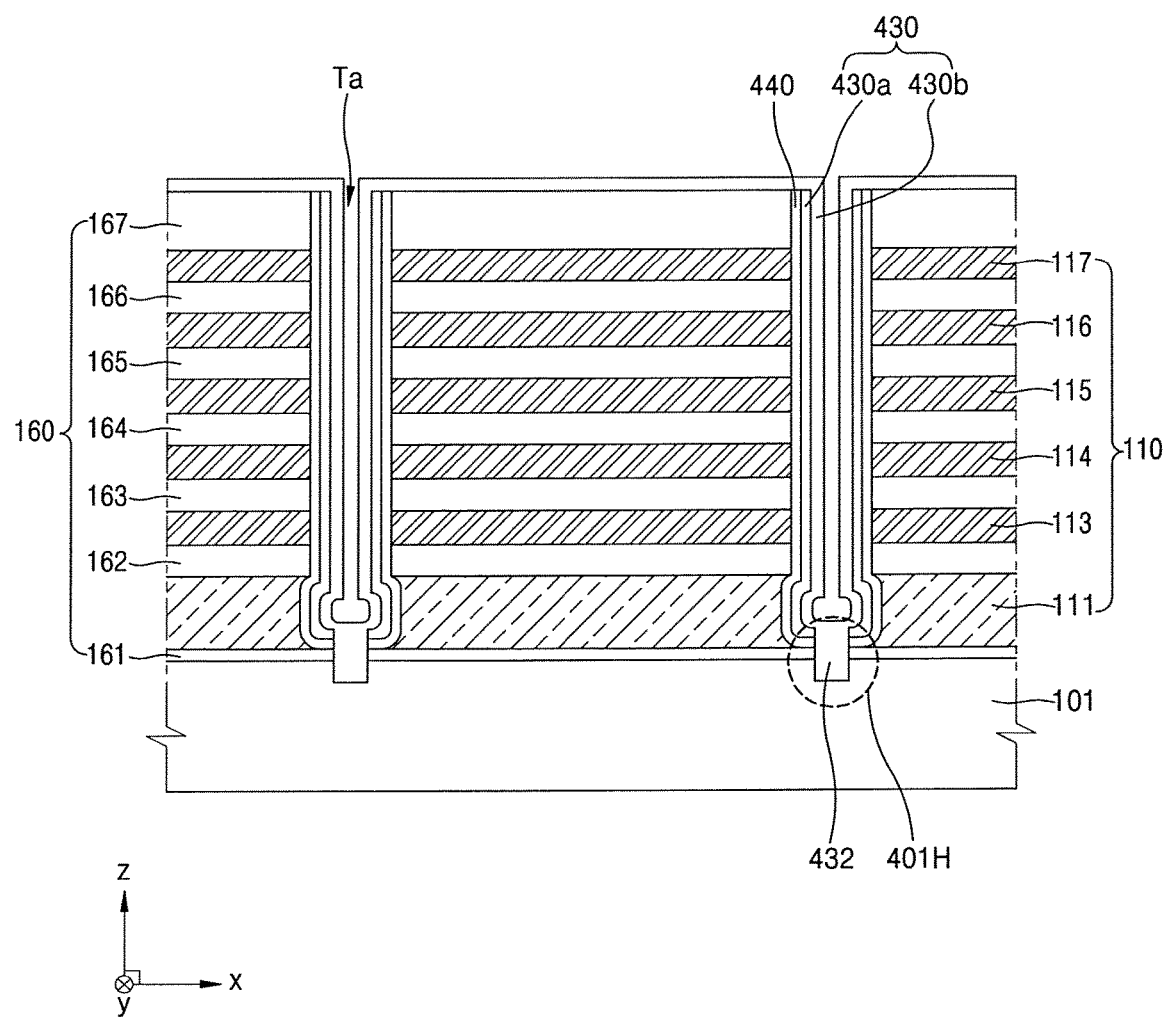

FIGS. 8A to 8C are cross-sectional views illustrated according to a process sequence in order to describe a method of manufacturing a non-volatile memory device, according to an exemplary embodiment of the inventive concept. In FIGS. 8A to 8C, elements that are the same as those in FIGS. 1 to 7D are designated by the same reference numerals, and a repeated description thereof is omitted for simplification.

FIGS. 8A to 8C illustrate a modified embodiment of processes described with reference to FIGS. 6E to 6G, and a description of processes before and after processes which will be described with reference to FIGS. 8A to 8C will be omitted.

Referring to FIG. 8A, the first interlayer insulating layer 161, the second interlayer insulating layers 162 to 167 including the first opening portions Ta, and the sacrificial layers 111 to 117 (110) may be formed on the substrate 101, and a gate dielectric layer 440 and a first channel layer 430a uniformly covering interior walls and a bottom surface of each of the first opening portions Ta may be sequentially formed. Respective formation processes of the interlayer insulating layers 160, the sacrificial layers 110, the gate dielectric layer 440, and the first channel layer 430a may be substantially the same as or similar to the processes described with reference to FIGS. 6A to 6E.

Referring to FIG. 8B, a contact hole 401H exposing the substrate 101 is formed by etching the gate dielectric layer 440 and the first channel layer 430a on bottom surfaces of the first opening portions Ta. The etching process may include performing anisotropic etching on the bottom surface of the first channel layer 430a, and etching the gate dielectric layer 440 by using the first channel layer 430a as an etching mask. The substrate 101 may be overly etched and recessed to have a predetermined depth.

Referring to FIG. 8C, a second channel layer 430b may be formed on the first channel layer 430a. The first and second channel layers 430a and 430b may be defined as a channel region 430. The contact hole 401H may be filled with the second channel layer 430b, and accordingly, the channel region 430 may include a contact portion 432. The channel region 430 may be electrically connected to the substrate 101 via the contact portion 432. The second channel layer 430b may include a material which is the same as that of the first channel layer 430a, and may include, for example, a semiconductor material such as polysilicon or single crystalline silicon.

In the present exemplary embodiment of the inventive concept, as the contact hole 401H is formed by using the first channel layer 430a without using a spacer, the contact portion 432 may have a larger width. Accordingly, a contact region of the channel region 430 and the substrate 101 may be larger, and thus, channel resistance may be smaller.

While the inventive concept has been particularly shown and described with reference to exemplary embodiments thereof, it will be understood that various changes in form and details may be made therein without departing from the spirit and scope of the appended claims.

What is claimed is:

1. A non-volatile memory device having a vertical structure, the non-volatile memory device comprising:
   a first interlayer insulating layer on a substrate;
   a first gate electrode disposed on the first interlayer insulating layer;
   second interlayer insulating layers and second gate electrodes alternately stacked on the first gate electrode;
   an opening portion penetrating the first gate electrode, the second interlayer insulating layers, and the second gate electrodes and exposing the first interlayer insulating layer;
   a gate dielectric layer covering side walls and a bottom surface of the opening portion; and
   a channel region formed on the gate dielectric layer, and penetrating a bottom surface of the gate dielectric layer and the first interlayer insulating layer and thus electrically connected to the substrate,
   wherein a separation distance between side walls of the gate dielectric layer in a region of the gate dielectric layer which contacts the first gate electrode is greater than that in a region of the gate dielectric layer which contacts one of the second gate electrodes, and
   the gate dielectric layer has a bulb-type cross-section structure.

2. The non-volatile memory device of claim 1, wherein the gate dielectric layer contacts a top surface of the first interlayer insulating layer.

3. The non-volatile memory device of claim 1, wherein a separation distance between side walls of the gate dielectric layer in a region of the gate dielectric layer which contacts the first interlayer insulating layer is greater than that in a region of the gate dielectric layer which contacts one of the second interlayer insulating layers.

4. The non-volatile memory device of claim 1, wherein the gate dielectric layer comprises:
   a tunneling insulating layer which contacts the channel region;
   a charge storage layer which contacts the tunneling insulating layer; and
   a first blocking insulating layer between the first gate electrode or the second gate electrodes and the charge storage layer.

5. The non-volatile memory device of claim 4, further comprising a second blocking insulating layer which contacts the first blocking insulating layer in a region between two adjacent interlayer insulating layers from among the first interlayer insulating layer and the second interlayer insulating layers.

6. The non-volatile memory device of claim 1, wherein the first interlayer insulating layer is thinner than each of the second interlayer insulating layers.

7. The non-volatile memory device of claim 1, wherein the first interlayer insulating layer comprises a middle temperature oxide (MTO) layer.

8. The non-volatile memory device of claim 1, wherein the first gate electrode is thicker than each of the second gate electrodes.

9. The non-volatile memory device of claim 1, wherein the channel region comprises:
  a first channel layer formed on the gate dielectric layer; and
  a second channel layer formed on the first channel layer,
  wherein the second channel layer penetrates a bottom surface of the first channel layer, a bottom surface of the gate dielectric layer, and the first interlayer insulating layer, and is connected to the substrate.

10. A non-volatile memory device having a vertical structure, the non-volatile memory device comprising:
  a first interlayer insulating layer on a substrate;
  a first gate electrode disposed on the first interlayer insulating layer;
  second interlayer insulating layers and second gate electrodes alternately stacked on the first gate electrode;
  a plurality of memory cell strings spaced apart from each other in a first direction parallel to a top surface of the substrate, wherein each of the memory cell strings penetrates the first gate electrode, the second interlayer insulating layers, and the second gate electrodes and vertically extends on the substrate; and
  a common source line structure penetrating the first gate electrode, the second interlayer insulating layers, and the second gate electrodes and extending in the first direction between memory cell strings that are adjacent to each other in a second direction perpendicular to the first direction from among the plurality of memory cell strings,
  wherein a width of each of the plurality of memory cell strings in the first direction in a region of the memory cell string which contacts the first gate electrode is greater than that in a region of the memory cell string which contacts one of the second gate electrodes.

11. The non-volatile memory device of claim 10, wherein the common source line structure comprises:
  a common source line which penetrates the first interlayer insulating layer and is connected to the substrate; and
  a common source line spacer disposed on side walls of the common source line and positioned between the common source line and the first gate electrode or the second gate electrodes.

12. The non-volatile memory device of claim 11, wherein a bottom surface of the common source line spacer contacts a top surface of the first interlayer insulating layer.

13. The non-volatile memory device of claim 11, wherein a bottom surface of the common source line is located at a lower level than a bottom surface of the common source line spacer.

14. The non-volatile memory device of claim 11, wherein the substrate comprises an impurity region in a recess of the top surface of the substrate,
  the common source line contacts the impurity region, and
  the common source line spacer is spaced apart from the impurity region.

15. The non-volatile memory device of claim 14, wherein the impurity region comprises a first impurity region and a second impurity region,
  wherein the second impurity region is located at center and contacts the common source line,
  the first impurity region surrounds the second impurity region, and
  impurity concentration of the first impurity region is smaller than that of the second impurity region.

16. The non-volatile memory device of claim 10, wherein a width of each of the plurality of memory cell strings in a region of the memory cell string which contacts a top surface of the first interlayer insulating layer is greater than that in a region of the memory cell string which contacts one of the second interlayer insulating layers.

17. The non-volatile memory device of claim 10, wherein each of the plurality of memory cell strings has a bulb-type cross-section structure.

18. The non-volatile memory device of claim 10, wherein each of the plurality of memory cell strings comprises:
  a filling insulating layer located at center of each of the plurality of memory cell strings;
  a channel region disposed on side walls and bottom of the filling insulating layer; and
  a gate dielectric layer disposed on side walls and some bottom portion of the channel region,
  wherein the gate dielectric layer contacts a top surface of the first interlayer insulating layer, and
  the channel region penetrates the gate dielectric layer and the first interlayer insulating layer vertically on the substrate and is electrically connected to the substrate.

19. The non-volatile memory device of claim 18, wherein a ground selection transistor, a plurality of memory cell transistors, and a string selection transistor are disposed along side walls of the gate dielectric layer in a third direction which is perpendicular to the first and second directions.

* * * * *